United States Patent
Park et al.

(10) Patent No.: US 12,055,852 B2
(45) Date of Patent: Aug. 6, 2024

(54) PHOTOSENSITIVE COMPOSITIONS, PREPARATION METHODS THEREOF, AND QUANTUM DOT POLYMER COMPOSITE PATTERN PRODUCED THEREFROM

(71) Applicants: SAMSUNG ELECTRONICS CO., LTD., Suwon-si (KR); SAMSUNG SDI CO., LTD., Yongin-si (KR)

(72) Inventors: Shang Hyeun Park, Yongin-si (KR); Hojeong Paek, Suwon-si (KR); Jonggi Kim, Suwon-si (KR); Nayoun Won, Suwon-si (KR); Shin Ae Jun, Seongnam-si (KR)

(73) Assignees: SAMSUNG ELECTRONICS CO., LTD, Gyeonggi-do (KR); SAMSUNG SDI CO., LTD., Gyeonggi-do (KR)

( * ) Notice: Subject to any disclaimer, the term of this patent is extended or adjusted under 35 U.S.C. 154(b) by 646 days.

(21) Appl. No.: 17/234,126

(22) Filed: Apr. 19, 2021

(65) Prior Publication Data

US 2021/0240077 A1    Aug. 5, 2021

Related U.S. Application Data

(63) Continuation of application No. 15/375,601, filed on Dec. 12, 2016, now Pat. No. 10,990,006.

(30) Foreign Application Priority Data

Dec. 17, 2015   (KR) .................. 10-2015-0181302

(51) Int. Cl.
*G03F 7/004*   (2006.01)
*C09K 11/02*   (2006.01)
(Continued)

(52) U.S. Cl.
CPC .......... *G03F 7/0043* (2013.01); *C09K 11/02* (2013.01); *C09K 11/08* (2013.01); *C09K 11/883* (2013.01);
(Continued)

(58) Field of Classification Search
CPC ....... C09K 11/02; C09K 11/08; C09K 11/883; G02B 5/207; G02B 5/223; G03F 7/0043;
(Continued)

(56) References Cited

U.S. PATENT DOCUMENTS 5,019,483 A    5/1991   Lin et al.
7,875,416 B2   1/2011   Park et al.
(Continued)

FOREIGN PATENT DOCUMENTS

JP    2012208494 A    10/2012
JP    2014052470      3/2014
(Continued)

OTHER PUBLICATIONS

Office Action dated Jun. 1, 2022 of the corresponding Korean Patent Application No. 10-2015-0181302, 8 pp.
(Continued)

*Primary Examiner* — C Melissa Koslow
(74) *Attorney, Agent, or Firm* — CANTOR COLBURN LLP

(57) ABSTRACT

A photosensitive composition including: a plurality of quantum dots, wherein the quantum dot includes an organic ligand bound to a surface of the quantum dot; a photoinitiator; a binder including a carboxylic acid group; a photopolymerizable monomer having a carbon-carbon double bond; and a solvent, wherein the photoinitiator includes a first photoinitiator including an oxime compound and a second photoinitiator including at least one selected from a phosphine oxide compound and an amino ketone compound.

17 Claims, 9 Drawing Sheets

(51) Int. Cl.
*C09K 11/08* (2006.01)
*C09K 11/88* (2006.01)
*G02B 5/20* (2006.01)
*G02B 5/22* (2006.01)
*G03F 7/00* (2006.01)
*G03F 7/027* (2006.01)
*G03F 7/029* (2006.01)
*G03F 7/031* (2006.01)
*G03F 7/033* (2006.01)

(52) U.S. Cl.
CPC .............. *G02B 5/207* (2013.01); *G02B 5/223* (2013.01); *G03F 7/0007* (2013.01); *G03F 7/0047* (2013.01); *G03F 7/027* (2013.01); *G03F 7/029* (2013.01); *G03F 7/031* (2013.01); *G03F 7/033* (2013.01)

(58) Field of Classification Search
CPC ........ G03F 7/027; G03F 7/007; G03F 7/0047; G03F 7/029; G03F 7/031; G03F 7/033
See application file for complete search history.

(56) References Cited

U.S. PATENT DOCUMENTS

| | | |
|---|---|---|
| 7,939,244 B2 | 5/2011 | Xu et al. |
| 8,211,597 B2 | 7/2012 | Su et al. |
| 8,642,991 B2 | 2/2014 | Park et al. |
| 8,758,654 B1 | 6/2014 | Uchikawa |
| 9,052,458 B2 | 6/2015 | Ushijima et al. |
| 10,203,599 B2 | 2/2019 | Kim et al. |
| 10,663,860 B2 | 5/2020 | Kwon et al. |
| 10,670,962 B2 | 6/2020 | Park et al. |
| 2003/0199616 A1 | 10/2003 | Yamashita et al. |
| 2006/0036023 A1 | 2/2006 | Kamata et al. |
| 2007/0231735 A1 | 10/2007 | Pawlowski et al. |
| 2010/0104981 A1 | 4/2010 | Choi et al. |
| 2010/0243304 A1 | 9/2010 | Otsuki et al. |
| 2010/0248088 A1 | 9/2010 | Naisby |
| 2011/0201717 A1 | 8/2011 | Held et al. |
| 2012/0171434 A1 | 7/2012 | Herlihy |
| 2014/0080061 A1 | 3/2014 | Redinger et al. |
| 2014/0275544 A1 | 9/2014 | McDaniel et al. |
| 2015/0056413 A1 | 2/2015 | Hwang et al. |
| 2015/0116415 A1 | 4/2015 | Chrétien et al. |
| 2015/0212411 A1 | 7/2015 | Park et al. |
| 2015/0299501 A1 | 10/2015 | Zhao |
| 2016/0011506 A1 | 1/2016 | Gu et al. |
| 2016/0215213 A1 | 7/2016 | Lee et al. |
| 2017/0052444 A1 | 2/2017 | Park |
| 2017/0059988 A1 | 3/2017 | Paek et al. |
| 2017/0115562 A1 | 4/2017 | Kim et al. |
| 2017/0176854 A1 | 6/2017 | Park et al. |
| 2017/0179338 A1 | 6/2017 | Park et al. |
| 2017/0183565 A1 | 6/2017 | Jun et al. |
| 2017/0240728 A1 | 8/2017 | Lee et al. |
| 2018/0044583 A1 | 2/2018 | Kwon et al. |
| 2018/0044586 A1 | 2/2018 | Kwon et al. |
| 2018/0148638 A1 | 5/2018 | Ahn et al. |
| 2018/0173020 A1 | 6/2018 | Chung et al. |
| 2018/0239245 A1 | 8/2018 | Yang et al. |
| 2018/0239246 A1 | 8/2018 | Park et al. |
| 2018/0239247 A1 | 8/2018 | Kwon et al. |
| 2018/0299775 A1 | 10/2018 | Kwon et al. |
| 2019/0129302 A1 | 5/2019 | Youn et al. |
| 2019/0278177 A1 | 9/2019 | Jeong et al. |

FOREIGN PATENT DOCUMENTS

| | | |
|---|---|---|
| JP | 2015-121702 A | 7/2015 |
| KR | 10-2013-0020345 A | 2/2013 |
| KR | 1435195 B1 | 8/2014 |
| WO | 2016134820 A1 | 9/2016 |
| WO | 2017054898 A1 | 4/2017 |

OTHER PUBLICATIONS

Barkhouse et al., "Thiols passivate recombination centers in colloidal quantum dots leading to enhanced photovoltaic device efficiency", ACSnano vol. 2(11) pp. 2356-2362 (2008).

PHOTOSENSITIVE COMPOSITIONS, PREPARATION METHODS THEREOF, AND QUANTUM DOT POLYMER COMPOSITE PATTERN PRODUCED THEREFROM

CROSS-REFERENCE TO RELATED APPLICATION

This is a continuation application that claims priority to U.S. application Ser. No. 15/375,601 filed Dec. 12, 2016, now U.S. Pat. No. 10,990,006, which in turn claims priority to Korean Patent Application No. 10-2015-0181302 filed in the Korean Intellectual Property Office on Dec. 17, 2015, and all the benefits accruing therefrom under 35 U.S.C. §§ 119, 120, the contents of which are incorporated herein by reference in their entirety.

BACKGROUND

1. Field

A photosensitive composition, a method of preparation thereof, and a quantum dot-polymer composite pattern produced therefrom are disclosed.

2. Description of the Related Art

A liquid crystal display (hereinafter, LCD) is a display in which a polarized light passed through a liquid crystal expresses a color while it is passed through an absorptive color filter. Unfavorably, LCD has a narrow viewing angle and a low luminance due to low light transmittance of the absorptive color filter. When the absorptive color filter is replaced by a photoluminescent type color filter, it may widen viewing angles and improve the luminance.

Quantum dots, which are dispersed in a polymer host matrix to form a composite, are applicable in various display devices. Quantum dots (QD) may be used as a light conversion layer in a light emitting diode (LED) or the like by dispersing in a host matrix of an inorganic material or a polymer. When a quantum dot is colloid-synthesized, the particle size may be relatively freely and uniformly controlled. When quantum dot has a size of less than or equal to about 10 nanometers (nm), the quantum confinement effects, in which the bandgap is increased as the size of the particle decreases, becomes significant, leading to enhancement of the energy density. As quantum dot has a theoretical quantum efficiency (QY) of 100% and may emit light having a high color purity (e.g., full width at half maximum (FWHM) of less than or equal to about 40 nm), a luminous efficiency may be enhanced and a color reproducibility may be improved. Therefore, if the quantum dots are patternable, they may be applied to various devices. For example, a color filter for a liquid crystal display may be capable of developing a high quality photoluminescent type LCD.

Thus, it is desired to develop new techniques of patterning the quantum dot-polymer composite.

SUMMARY

An embodiment provides a photosensitive composition capable of providing a pattern of a quantum dot-polymer composite.

Another embodiment provides a pattern of a quantum dot-polymer composite prepared from the composition.

Yet another embodiment provides an electronic device including the pattern of the quantum dot-polymer composite.

In an embodiment, a photosensitive composition includes:
a plurality of quantum dots, wherein the quantum dot includes an organic ligand on a surface thereof;
a photoinitiator;
a binder including a carboxylic acid group;
a photopolymerizable monomer having a carbon-carbon double bond; and
a solvent,
wherein the photoinitiator includes a first photoinitiator including an oxime compound and a second photoinitiator including at least one selected from a phosphine oxide compound and an amino ketone compound.

The plurality of quantum dots may be dispersed by the carboxylic acid group (—COOH)-containing polymer in the composition. Therefore, the photosensitive composition includes a quantum dot dispersion including the carboxylic acid group (—COOH)-containing polymer and a quantum dot dispersed in the carboxylic acid group containing polymer.

The quantum dot may include an organic ligand bound to a surface thereof.

The first photoinitiator may have a wavelength of maximum absorption ($\lambda_{max}$) of about 250 nanometers to about 350 nanometers.

The second photoinitiator may have a wavelength of maximum absorption ($\lambda_{max}$) of about 310 nanometers to about 400 nanometers.

The organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are each independently a C5 to C24 aliphatic hydrocarbon group or a C6 to C20 aromatic hydrocarbon group), a polymer organic ligand, or a combination thereof.

The quantum dot may include a Group II-VI compound, a Group III-V compound, a Group IV-VI compound, a Group IV element or compound, a Group I-III-VI compound, a Group I-II-IV-IV compound, or a combination thereof.

The oxime compound may include an arylthioaryl group, an acyl group RC(=O)— (wherein R is a C1 to C30 alkyl group, a C6 to C30 aryl group, or a C6 to C30 cycloalkyl group), a C3 to C30 cycloalkyl group, an alkanedione group, or a combination thereof.

The oxime compound may be an O-acyloxime compound.

The oxime compound may include 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, 1-(4-phenylsulfonylphenyl)-butane-1,2-dione-2-oxime-O-benzoate, 1-(4-phenylsulfonylphenyl)-octane-1,2-dione-2-oxime-O-benzoate, 1-(4-phenylsulfonylphenyl)-octan-1-one-oxime-O-acetate, 1-(4-phenylsulfonylphenyl)-butan-1-one-oxime-O-acetate, or a combination thereof.

The aminoketone compound may include a dialkylamino group, a morpholinylphenyl group, an acetophenone group, or a combination thereof.

The aminoketone compound may include 2-dimethylamino-2-(4-methylbenzyl)-1-(4-morpholin-4-yl-phenyl)-butan-1-one.

The phosphine oxide compound may include acylphosphine oxide.

The phosphine oxide compound may include a combination of monoacylphosphine oxide and a bisacylphosphine oxide compound.

The phosphine oxide compound may include phenyl-bis (2,4,6-trimethylbenzoyl)-phosphine oxide, 2,4,6-trimethylbenzoyl diphenyl phosphine oxide, or a combination thereof.

The composition may further include a third photoinitiator selected from a triazine compound, an acetophenone compound, a benzophenone compound, a carbazole compound, an alpha-hydroxyketone (α-hydroxyketone) compound, a metallocene compound, or a combination thereof.

The triazine compound may include 2,4,6-trichloro-s-triazine, 2-phenyl-4,6-bis(trichloromethyl)-s-triazine, 2-(3', 4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, or 2-4-bis(trichloromethyl)-6-(4-methoxystyryl)-s-triazine.

The acetophenone compound may include 2,2'-diethoxyacetophenone, 2,2'-dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, or a combination thereof.

The benzophenone compound may include benzophenone, benzoylbenzoic acid, benzoylbenzoic acid methyl ester, 4-phenylbenzophenone, hydroxybenzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, or a combination thereof.

A weight ratio of the first photoinitiator and the second photoinitiator may be about 1:2 to 1:0.1.

The third photoinitiator may be present in an amount of less than or equal to about 100 percent by weight, less than or equal to about 90 percent by weight, less than or equal to about 80 percent by weight, less than or equal to about 70 percent by weight, less than or equal to about 60 percent by weight, less than or equal to about 50 percent by weight, less than or equal to about 40 percent by weight, less than or equal to about 30 percent by weight, less than or equal to about 20 percent by weight, less than or equal to about 10 percent by weight, less than or equal to about 5 percent by weight, or less than or equal to about 1 percent by weight, based on the total weight of the first photoinitiator and the second photoinitiator, but is not limited thereto.

The binder may have an acid value of greater than or equal to about 50 milligrams of KOH per gram of the binder.

The binder may include:
a copolymer, which is a reaction product of a monomer composition including:
a first monomer including a carboxylic acid group and a carbon-carbon double bond,
a second monomer including a carbon-carbon double bond and a hydrophobic moiety and not including a carboxylic acid group, and optionally,
a third monomer including a carbon-carbon double bond and a hydrophilic moiety and not including a carboxylic acid group;
a polymer having a main chain comprising a carboxylic acid group and a backbone structure incorporated in the main chain, wherein the backbone structure includes a quaternary carbon atom, which is a part of a cyclic group, and two aromatic rings bound to the quaternary carbon atom; or
a combination thereof.

In the monomer composition,
a content of the first monomer may be greater than or equal to about 10 mole percent and less than or equal to about and 90 mole percent, a content of the second monomer may be greater than or equal to about mole percent and less than or equal to about 90 mole percent, and a content of the third monomer may be less than or equal to about 20 mole percent.

The backbone structure of the binder may be represented by Chemical Formula A:

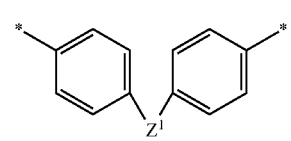

Chemical Formula A wherein in Chemical Formula A,
* indicates a portion linked to an adjacent atom of the main chain of the binder,
$Z^1$ is one of linking moieties represented by any one of Chemical Formulae A-1 to A-6, and
wherein in Chemical Formulae A-1 to A-6, * indicates a portion linked to an aromatic moiety:

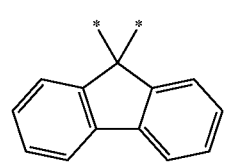

Chemical Formula A-1

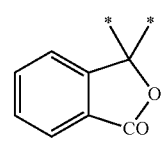

Chemical Formula A-2

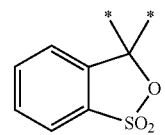

Chemical Formula A-3

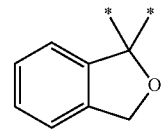

Chemical Formula A-4

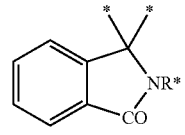

Chemical Formula A-5 wherein in Chemical Formula A-5, $R^a$ is a hydrogen atom, an ethyl group, $C_2H_4Cl$, $C_2H_4OH$, $CH_2CH=CH_2$, or a phenyl group,

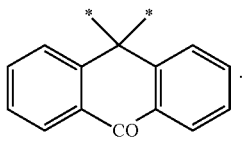

Chemical Formula A-6

The photopolymerizable monomer may include:
a main monomer having 1 to 6 (meth)acrylate groups; and optionally,
at least one of a first auxiliary monomer having 8 to 20 (meth)acrylate groups and a second auxiliary monomer represented by Chemical Formula 1:

Chemical Formula 1 wherein A is a C1 to C40 aliphatic hydrocarbon group, a C6 to C40 aromatic hydrocarbon group, a moiety including at least two C6 to C40 aromatic hydrocarbon groups linked by a substituted or unsubstituted C1 to C10 alkylene group, an ether group or a combination thereof, or an ether group, $L_1$ and $L_2$ are the same or different, and are each independently a C2 to C5 substituted or unsubstituted oxyalkylene group, and m and n are each an integer ranging from 0 to 20, provided that m and n are not simultaneously 0, $L_3$ and $L_4$ are the same or different, and are each independently a single bond, O—$(CH_2)_n$—CH(OH)—$CH_2$—, or —$(CH_2)_n$—CH(OH)—$CH_2$—, and $R^1$ and $R^2$ are the same or different, and are each independently $CR_2$=CR- (wherein R is hydrogen or a methyl group) or $CR_2$=CRC(=O)—(wherein R is hydrogen or a methyl group).

The composition may further include a reactive compound including at least two thiol groups and represented by Chemical Formula 2:

Chemical Formula 2 wherein in Chemical Formula 2, $R^1$ is selected from hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are each independently hydrogen or a C1 to C30 linear or branched alkyl group); an isocyanate group; a halogen; -ROR' (wherein R is a substituted or unsubstituted C1 to C20 alkylene group and R' is hydrogen or a C1 to C20 linear or branched alkyl group); acyl halide (-RC(=O)X, wherein R is a substituted or unsubstituted (e.g., C1 to C20) alkylene group and X is a halogen); —C(=O)OR' (wherein R' is hydrogen or a C1 to C20 linear or branched alkyl group); —CN; —C(=O)ONRR' (wherein R and R' are each independently hydrogen or a C1 to C20 linear or branched alkyl group); or a combination thereof, $L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one of non-adjacent methylene (—$CH_2$—) groups of the substituted or unsubstituted C1 to C30 alkylene group may be replaced by a sulfonyl group (—$SO_2$—), a carbonyl group (—CO—), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or a combination thereof, $Y_1$ is a single bond; a substituted or unsubstituted C1 to C30 alkylene group; a substituted or unsubstituted C2 to C30 alkenylene group; or a substituted C1 to C30 alkylene group or a C2 to C30 alkenylene group wherein at least one methylene group (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group) or a combination thereof, m is an integer of 1 or more,
k1 is 0 or an integer of 1 or more,
k2 is an integer of 1 or more, and
a sum of m and k2 is an integer of 3 or more,
provided that when $Y_1$ is not a single bond, m does not exceed the valence of $Y_1$, and
provided that a sum of k1 and k2 does not exceed the valence of $L_1$.

The reactive compound may include ethoxylated pentaerythritol tetra(3-mercaptopropionate), trimethylolpropanetri(3-mercaptopropionate), trimethylolpropanetri(3-mercaptoacetate), glycol di-3-mercaptopropionate, polypropylene glycol 3-mercaptopropionate, ethoxylated trimethylpropane tri(3-mercaptopropionate), glycol dimercaptoacetate, ethoxylated glycol dimercaptoacetate, 1,4-bis(3-mercaptobutyryloxy)butane, trimethylolpropanetris(3-mercaptopropionate), tris[2-(3-mercaptopropinonyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol structural units, or a combination thereof.

The photosensitive composition may be developable with an alkali aqueous solution after exposure.

The photosensitive composition may further include a light diffusing agent selected from a metal oxide particle, a metal particle, and a combination thereof.

The photosensitive composition may include:
about 1 percent by weight to about 40 percent by weight of the quantum dot;
about 0.5 percent by weight to about 35 percent by weight of the binder; about 1 percent by weight to about 30 (e.g., about 25 percent) by weight of the photopolymerizable monomer;
about 0.01 percent by weight to about 10 percent by weight of the photoinitiator; and
a balance amount of the solvent, based on the total weight of the composition.

Another embodiment provides a quantum dot-polymer composite pattern produced by the composition.

Yet another embodiment provides an electronic device including the quantum dot-polymer composite pattern.

The aforementioned photosensitive composition may provide a quantum dot polymer composite pattern having improved pattern quality via an environmentally friendly method.

BRIEF DESCRIPTION OF THE DRAWINGS

The above and other advantages and features of this disclosure will become more apparent by describing exemplary embodiments thereof in further detail with reference to the accompanying drawings, in which.

DETAILED DESCRIPTION

Figure 1:
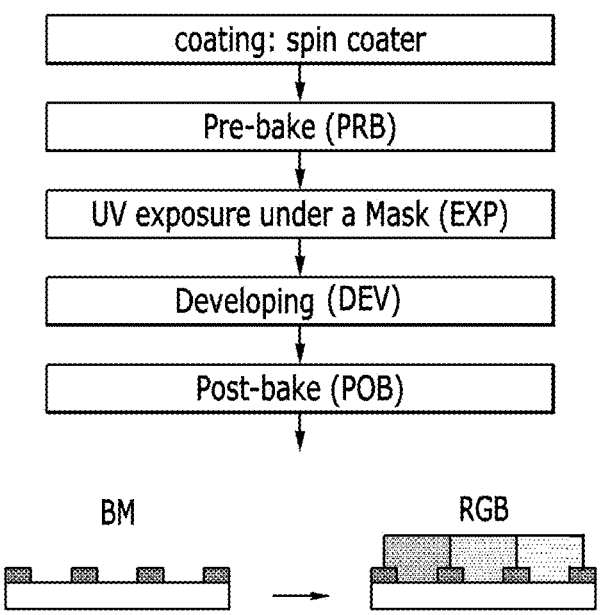
FIG. 1 is a diagram showing a process for preparing a pattern for a color filter using a photosensitive composition (photoresist) according to an embodiment.

Advantages and characteristics of this disclosure, and a method for achieving the same, will become evident referring to the following exemplary embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Exemplary embodiments are described herein with reference to illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Further, the singular includes the plural unless mentioned otherwise.

In the drawings, the thickness of layers, films, panels, regions, etc., are exaggerated for clarity. Like reference numerals designate like elements throughout the specification.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise. Unless specified otherwise, the term "or" means "and/or." As used herein, the term "and/or" includes any and all combinations of one or more of the associated items. Expressions such as "at least one of," when preceding a list of elements, modify the entire list of elements and do not modify the individual elements of the list.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "combination thereof" refers to a mixture, a stacked structure, a composite, an alloy, a blend, a reaction product, or the like.

As used herein, when a definition is not otherwise provided, the term "substituted" refers to a compound or a group or a moiety wherein at least one of hydrogen atoms thereof is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br or —I), a hydroxy group (—OH), a nitro group (—NO$_2$), a cyano group (—CN), an amino group (—NRR', wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M2, wherein M is an organic or inorganic cation), and a combination thereof.

As used herein, when a definition is not otherwise provided, the term "monovalent organic functional group" refers to a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to a group or fragment including 1 to 3 heteroatoms selected from N, O, S, Si, and P.

As used herein, when a definition is not otherwise provided, the term "alkyl group" refers to a group derived from a straight or branched chain saturated aliphatic hydrocarbon having the specified number of carbon atoms and having a valence of at least one.

As used herein, when a definition is not otherwise provided, the term "alkoxy group" refers to "alkyl-O-", wherein the term "alkyl" has the same meaning as described above.

As used herein, when a definition is not otherwise provided, the term "alkenyl group" refers to a straight or branched chain, monovalent hydrocarbon group having at least one carbon-carbon double bond.

As used herein, when a definition is not otherwise provided, the term "alkynyl group" refers to a straight or branched chain, monovalent hydrocarbon group having at least one carbon-carbon triple bond.

As used herein, when a definition is not otherwise provided, the term "cycloalkyl group" refers to a monovalent group having one or more saturated rings in which all ring members are carbon.

As used herein, when specific definition is not otherwise provided, the term "cycloalkenyl group" refers to a monovalent group having one or more rings and one or more carbon-carbon double bond in the ring, wherein all ring members are carbon.

As used herein, when specific definition is not otherwise provided, the term "cycloalkynyl group" refers to a monovalent group having one or more rings and one or more carbon-carbon triple bond in the ring, wherein all ring members are carbon.

As used herein, when specific definition is not otherwise provided, the term "acyl group" refers to "alkyl-C(=O)—", wherein the term "alkyl" has the same meaning as described above.

As used herein, when a definition is not otherwise provided, the term "heterocycloalkyl group" refers to a cycloalkyl group as defined above, wherein 1 to 3 carbon atoms are replaced with heteroatoms selected from N, O, S, Si, and P.

As used herein, when a definition is not otherwise provided, the term "aryl", which is used alone or in combination, refers to an aromatic hydrocarbon group containing at least one ring and having the specified number of carbon atoms. The term "aryl" may be construed as including a group with an aromatic ring fused to at least one cycloalkyl ring.

As used herein, when a definition is not otherwise provided, the term "heteroaryl group" refers to an aryl group including carbon and 1 to 3 heteroatoms selected from the group consisting of N, O, S, and P as ring atoms.

As used herein, when a definition is not otherwise provided, the term "arylalkyl group" refers to a substituted or unsubstituted aryl group covalently linked to an alkyl group that is linked to a compound.

As used herein, when a definition is not otherwise provided, the term "alkylene group" refers to a straight or branched saturated aliphatic hydrocarbon group having a valence of at least two, optionally substituted with one or more substituents.

As used herein, when a definition is not otherwise provided, the term "oxyalkylene group" refers to "alkylene-O-", wherein the term "alkylene" has the same meaning as described above.

As used herein, when a definition is not otherwise provided, the term "alkenylene group" refers to a straight or branched aliphatic hydrocarbon group having a valence of at least two, having at least one carbon-carbon double bond, optionally substituted with one or more substituents where indicated, provided that the valence of the alkylene group is not exceeded.

As used herein, when a definition is not otherwise provided, the term "cycloalkylene group" refers to a cyclic hydrocarbon group having a valence of at least two, optionally substituted with one or more substituents where indicated, provided that the valence of the cycloalkylene group is not exceeded.

As used herein, when a definition is not otherwise provided, the term "arylene group" refers to a functional group having a valence of at least two obtained by removal of at least two hydrogens in an aromatic ring, optionally substituted with one or more substituents where indicated, provided that the valence of the arylene group is not exceeded.

As used herein, when a definition is not otherwise provided, the term "heteroarylene group" refers to a functional group having a valence of at least two obtained by removal of two hydrogens in an aromatic ring, containing one to three heteroatoms selected from the group consisting of N, O, S, Si, and P as ring-forming elements, optionally substituted with one or more substituents where indicated, provided that the valence of the heteroarylene group is not exceeded.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C30 alkyl" refers to a C1 to C30 alkyl group substituted with a C6 to C30 aryl group, the total number of carbon atoms in the resulting aryl substituted alkyl group is C7 to C60.

As used herein, when a definition is not otherwise provided, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group and a C3 to C30 cycloalkynyl group.

As used herein, the term "(meth)acrylate" refers to acrylate and/or methacrylate.

As used herein, the term "hydrophobic moiety" refers to a moiety that causes a given compound including the same to show agglomeration in an aqueous solution and to have a tendency of repelling water. For example, the hydrophobic moiety may include an aliphatic hydrocarbon group having a carbon number of greater than or equal to 2 (an alkyl group, an alkenyl group, an alkynyl group, etc.), an aromatic hydrocarbon group having a carbon number of greater than or equal to 6 (a phenyl group, a naphthyl group, an aralkyl group, etc.), or an alicyclic hydrocarbon group of having a carbon number of greater than or equal to 5 (a cyclohexyl group, a norbornyl group, etc.). The hydrophobic moiety substantially lacks an ability of making a hydrogen bond with an ambient medium and is not substantially mixed with the medium as its polarity is not matched with that of the medium.

As used herein, the term "group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Ru, and Cs, but are not limited thereto.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

As used herein, the term "visible light" refers to light having a wavelength of about 390 nanometers (nm) to about 700 nm. As used herein, the term "UV" refers to light having a wavelength of about 200 nm to about 400 nm.

As used herein, the term "dispersion" refers to a dispersion wherein a dispersed phase is a solid and a continuous phase includes a liquid. For example, the term "dispersion" may refer to a colloidal dispersion wherein the dissolved or dispersed phase has a dimension of about 1 nm to about 1 micrometer (µm).

In an embodiment, a photosensitive composition includes:
a plurality of quantum dots, wherein the quantum dot include an organic ligand on a surface thereof (e.g., the quantum dot may include an organic ligand bound to a surface of the quantum dot);
a photoinitiator;
a binder including a carboxylic acid group (—COOH);
a photopolymerizable monomer having a carbon-carbon double bond; and
a solvent,
wherein the photoinitiator includes a first photoinitiator including an oxime compound and a second photoinitiator including at least one selected from a phosphine oxide compound and an amino ketone compound. The plurality of quantum dots may be dispersed (for example, separated from one another) by the carboxylic acid group (—COOH)-containing polymer to form a quantum dot dispersion. The quantum dot dispersion includes the carboxylic acid group (—COOH)-containing polymer and the plurality of quantum dots dispersed in the carboxylic acid group (—COOH)-containing polymer. The quantum dot dispersion may further include a solvent.

The first photoinitiator may have a wavelength of maximum absorption ($\lambda_{max}$) of about 250 nm to about 350 nm, and the second photoinitiator may have a wavelength of maximum absorption ($\lambda_{max}$) of about 310 nm to about 400 nm. In an embodiment, the wavelength of maximum absorption of the first photoinitiator may be smaller than the wavelength of maximum absorption of the second photoinitiator. In another embodiment, the wavelength of maximum absorption of the first photoinitiator may be greater than the wavelength of maximum absorption of the second photoinitiator.

The organic ligand may be RCOOH, $RNH_2$, $R_2NH$, $R_3N$, RSH, $R_3PO$, $R_3P$, ROH, RCOOR', $RPO(OH)_2$, $R_2POOH$ (wherein R and R' are each independently a C5 to C24 aliphatic hydrocarbon group or a C6 to C20 aromatic hydrocarbon group), polymer organic ligand, or a combination thereof. The organic ligand may have a hydrophobic moiety. The organic ligand may be specifically or non-specifically bound to the surface of the quantum dot.

Specific examples of the organic ligand may include:
thiol compounds such as methane thiol, ethane thiol, propane thiol, butane thiol, pentane thiol, hexane thiol, octane thiol, dodecane thiol, hexadecane thiol, octadecane thiol, or benzyl thiol;
amines such as methylamine, ethylamine, propylamine, butylamine, pentylamine, hexylamine, octylamine, nonylamine, decylamine, dodecyl amine, hexadecyl amine, octadecyl amine, dimethyl amine, diethyl amine, dipropyl amine, tributylamine, trioctylamine, and the like;
carboxylic acids such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like;
phosphines such as methyl phosphine, ethyl phosphine, propyl phosphine, butyl phosphine, pentyl phosphine, octyl phosphine, dioctyl phosphine, tributyl phosphine, trioctyl phosphine, diphenyl phosphine, triphenyl phosphine, and the like;
phosphine oxides such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, trioctyl phosphine oxide; diphenyl phosphine oxide, triphenyl phosphine oxide;
C5 to C20 alkylphosphonic acid; and
C5 to C20 alkylphosphinic acid such as hexylphosphinic acid, octylphosphinic acid, dodecylphosphinic acid, tetradecylphosphinic acid, hexadecylphosphinic acid, octadecylphosphinic acid; and the like, but are not limited thereto.

The organic ligand may be a single compound or a combination (for example, a mixture) of two or more compounds.

The quantum dot (hereinafter, also referred to as a semiconductor nanocrystal) is not particularly limited, and may be a commercially available quantum dot. For example, the quantum dot may be a Group II-VI compound, a Group III-V compound, a Group IV-VI compound, a Group IV compound, a Group II-III-IV compound, a Group I-II-IV-VI compound, or a combination thereof.

The Group II-VI compound may be selected from
a binary compound selected from CdSe, CdTe, ZnS, ZnSe, ZnTe, ZnO, HgS, HgSe, HgTe, MgSe, MgS, and a combination thereof;
a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and
a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group II-VI compound may further include a Group III metal.

The Group III-V compound may be selected from:
a binary compound selected from GaN, GaP, GaAs, GaSb, AlN, AlP, AlAs, AlSb, InN, InP, InAs, InSb, and a combination thereof;
a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary compound selected from GaAlNP, GaAl-NAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group III-V compound may further include a Group II metal (e.g., InZnP).

The Group IV-VI compound may be selected from a binary compound selected from SnS, SnSe, SnTe, PbS, PbSe, PbTe, and a combination thereof;

a ternary compound selected from SnSeS, SnSeTe, SnSTe, PbSeS, PbSeTe, PbSTe, SnPbS, SnPbSe, SnPbTe, and a combination thereof; and a quaternary compound selected from SnPbSSe, SnPbSeTe, SnPbSTe, and a combination thereof.

Examples of the Group 1-III-VI compound may include CuInSe$_2$, CuInS$_2$, CuInGaSe, and CuInGaS, but is not limited thereto.

The Group I-II-IV-IV compound may include CuZnSnSe, and CuZnSnS, but is not limited thereto.

The Group IV compound may include a single element selected from Si, Ge, and a combination thereof; and a binary compound selected from SiC, SiGe, and a combination thereof.

The binary compound, the ternary compound, or the quaternary compound can respectively be in a uniform concentration in the semiconductor nanocrystal particle or partially different concentrations in the same particle.

In addition, the semiconductor nanocrystal particle may have a core-shell structure wherein a first semiconductor nanocrystal is surrounded by a second semiconductor nanocrystal different from the first semiconductor nanocrystal. The interface between the core and the shell may have a concentration gradient wherein the concentration of an element of the shell decreases toward the core. In addition, the semiconductor nanocrystal particle may have a semiconductor nanocrystal core and a multilayered shell surrounding the semiconductor nanocrystal core. The core and multi-shell structure has at least two layers wherein each layer may be a single composition, an alloy, or a layer having a concentration gradient.

In the semiconductor nanocrystal particle, the materials of the shell may have a larger energy bandgap than the material of the core, and thereby the semiconductor nanocrystal may exhibit a quantum confinement effect more effectively. In the case of a multi-shell type of semiconductor nanocrystal particle, the bandgap of the material of an outer shell may have higher energy than the energy of the material of an inner shell (a shell that is closer to the core). In this case, the semiconductor nanocrystal may emit light of a wavelength ranging from UV to infrared light.

The semiconductor nanocrystal may have quantum efficiency of greater than or equal to about 10%, greater than or equal to about 30%, for example, greater than or equal to about 50%, greater than or equal to about 60%, greater than or equal to about 70%, or greater than or equal to about 90%.

The semiconductor nanocrystal may have a narrower FWHM, so as to realize enhanced color purity (or color reproducibility) in a display. The semiconductor nanocrystal may have a FWHM of less than or equal to about 45 nanometers (nm), for example less than or equal to about 40 nm, or less than or equal to about 30 nm. While not wishing to be bound by theory, it is understood that within such ranges, a device including the nanocrystal may have enhanced color purity or improved color reproducibility.

The quantum dot may have a particle diameter (an average largest particle diameter for a non-spherical shape) of about 1 nm to about 100 nm. For example, the quantum dot may have a particle diameter (an average largest particle diameter for a non-spherical shape) of about 1 nm to about 20 nm, for example, about 2 nm (or about 3 nm) to about 15 nm.

The shape of the quantum dot may have a generally-used shape in this art, so the shape of the quantum dot is not particularly limited. For example, the quantum dot may have spherical, pyramidal, multi-armed, or cubic nanoparticles, nanotubes, nanowires, nanofibers, nanoplate particles, or the like.

The quantum dot may be commercially available or may be synthesized according to any method. For example, several nano-sized quantum dots may be synthesized by using a wet chemical process. In the wet chemical process, the precursors of the quantum dots react in an organic solvent to grow nanocrystal particles, and the organic solvent or a ligand compound may coordinate the surface of the semiconductor nanocrystal, to control the growth of the nanocrystal. Examples of the organic solvents and the ligand compounds are known. The organic solvent coordinated to the surface of the quantum dot may affect stability of a device, and thus excess of the organic material that is not coordinated to the surface of the quantum dot may be removed by pouring the material in excess of non-solvent, and centrifuging the resulting mixture. Examples of the non-solvent may be acetone, ethanol, methanol, and the like, but are not limited thereto. After the removal of the extra organic material, the amount of the organic material coordinated to the surface of the quantum dot may be less than or equal to about 50% by weight (wt %), for example, less than or equal to about 30 wt %, less than or equal to about 20 wt %, or less than or equal to about 10 wt %. The organic material may include a ligand compound, an organic solvent, or a combination thereof.

In the composition, a content of the quantum dot including the organic ligand may be greater than or equal to about 1 wt %, for example, greater than or equal to about 5 wt %, or greater than or equal to about 10 wt %, based on the total weight of the composition. The content of the quantum dot including the organic ligand may be less than or equal to about 40 wt %, for example, less than or equal to about 35 wt %, based on the total weight of the composition.

The photosensitive composition according to an embodiment includes a combination of the first photoinitiator and the second photoinitiator as described above.

As quantum dot has a theoretical quantum efficiency (QY) of 100% and may emit light having a high color purity (e.g., full width at half maximum (FWHM) of less than or equal to about 40 nm), a luminous efficiency of the quantum dot may be enhanced and a color reproducibility of the quantum dot may be improved. Thus, it is expected that the color filter including a quantum dot polymer composite accomplish a display having a high luminance, a wide viewing angle and high color reproducibility. However, to be applied as a color filter, the photosensitive composition including quantum dots may include a relatively large amount of quantum dots (e.g., greater than or equal to about 5% of the total weight of the composition). In addition, the photoresist including quantum dots may include a light diffusing agent for improving its light emitting characteristics (which will be described in detail below), a thiol additive for the stability of composite (which will be also described in detail below) or the like.

The aforementioned components may be required to provide a quantum dot-polymer composite having the improved light characteristics and stability, but, in view of pattern formation, the components may suppress the good patterning properties. For example, the photoresist composition including the aforementioned components tends to form a pattern having an undercut in which the pattern width is narrower going to the substrate. Without wishing to be bound by any particular theory, it is understood that such problems may result from the fact that the quantum dot, the light diffusing agent and/or the thiol additive may bring forth a significant difference of curing rate between the upper part and the lower part of a pattern. For example, when the thiol additive is added in order to improve the stability of the quantum dots, the curing reaction rate of the composition may be also increased, so the upper part of the pattern is cured at a higher rate, but the lower part of the pattern is cured at a lower rate, and thus, the undercut phenomenon may occur.

The photosensitive composition according to an embodiment includes a combination of the first photoinitiator and the second photoinitiator, in order to control the curing rate of the upper part and the lower part of the pattern. Thus, when the composition is exposed to light, the cured states of the upper part and the lower part of the pattern are made to become uniform to alleviate the undercut phenomenon in the obtained pattern.

The first photoinitiator includes an oxime compound.

For example, the oxime compound may include an arylthioaryl group such as phenylthiophenyl group, an acyl group (e.g., an acetyl group), RC(=O)—(wherein R is a C1 to C30 alkyl group, a C6 to C30 aryl group, or a C6 to C30 cycloalkyl group) such as a benzoyl group, a C3 to C30 cycloalkyl group such as a cyclopentyl group, an alkanedione group, or a combination thereof.

The oxime compound may be an O-acyloxime compound.

The oxime compound may be a compound represented by the following chemical formula:

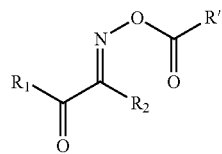

wherein in the above chemical formula,
R₁ is an arylthioaryl group (e.g., phenyl thiophenyl group),
R₂ is a benzoyl group, and
R' is a C6 to C30 aryl group (e.g., a phenyl group).

For example, the oxime compound may be 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, 1-(4-phenylsulfonylphenyl)-butane-1,2-dione-2-oxime-O-benzoate, 1-(4-phenylsulfonylphenyl)-octane-1,2-dione-2-oxime-O-benzoate, 1-(4-phenylsulfonylphenyl)-octan-1-one oxime-O-acetate, 1-(4-phenylsulfonylphenyl)-butan-1-one oxime-O-acetate, or a combination thereof.

The second initiator may include at least one compound selected from a phosphine oxide compound and an amino ketone compound.

For example, the aminoketone compound may include a dialkylamino group having two C1 to C10 alkyl groups such as a dimethylamino group or a diethylamino group, a morpholinyl group, an aryl group, an acetophenone group, or a combination thereof.

For example, the aminoketone compound may be a compound represented by chemical formula:

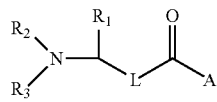

wherein
R₁, R₂, and R₃ are each independently a substituted or unsubstituted C1 to C10 alkyl group (e.g., a methyl group, an ethyl group, a propyl group, a butyl group, etc.),
L is a single bond or a C1 to C10 alkylene group, and
A is a C6 to C30 aryl group substituted with a morpholinyl group (e.g., a morpholinophenyl group).

The aminoketone compound may include 2-dimethylamino-2-(4-methylbenzyl)-1-(4-morpholin-4-yl-phenyl)-butan-1-one.

The phosphine oxide compound may include acylphosphine oxide.

The phosphine oxide compound may include a combination of monoacylphosphine oxide and a bisacylphosphine oxide compound.

The phosphine oxide compound may include phenyl-bis(2,4,6-trimethylbenzoyl)-phosphine oxide, 2,4,6-trimethylbenzoyl diphenylphosphine oxide, or a combination thereof.

The composition may further include a third photoinitiator selected from a triazine compound, an acetophenone compound, a benzophenone compound, a carbazole compound, an alpha-hydroxyketone (α-hydroxyketone) compound, a methallocene compound, or a combination thereof.

The triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, or a combination thereof.

The acetophenone compound may include 2,2'-diethoxyacetophenone, 2,2'-dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, or a combination thereof.

The benzophenone compound may include benzophenone, benzoylbenzoic acid, benzoylbenzoic acid methyl ester, 4-phenylbenzophenone, hydroxybenzophenone, acrylated benzophenone, 4,4'-bis(dimethylamino)benzophenone, 4,4'-bis(diethylamino)benzophenone, 4,4'-dimethylaminobenzophenone-4,4'-dichlorobenzophenone, 3,3'-dimethyl-2-methoxybenzophenone, or a combination thereof.

A weight ratio of the first photoinitiator and the second photoinitiator may be about 1:2 to 1:0.1, for example about 1:1 to 1:0.25.

In the photosensitive composition, a content of the photoinitiator may be greater than or equal to about 0.01 wt %, for example, greater than or equal to about 0.1 wt %, or greater than or equal to about 1 wt %, based on the total amount of the composition. A content of the photoinitiator may be less than or equal to about 10 wt %, for example, less than or equal to about 5 wt %.

The photosensitive composition according to an embodiment further includes a binder including a carboxylic acid group (—COOH). The carboxylic acid group-containing binder may include:

a copolymer, which is a reaction product of a monomer composition including:
a first monomer including a carboxylic acid group and a carbon-carbon double bond,
a second monomer including a carbon-carbon double bond and a hydrophobic moiety, and not including a carboxylic acid group, and optionally,
a third monomer including a carbon-carbon double bond and a hydrophilic moiety, and not including a carboxylic acid group,
a multiaromatic ring-containing polymer having a main chain including a carboxylic acid group and a backbone structure incorporated in the main chain, wherein the backbone structure comprises a quaternary carbon atom, which is a part of a cyclic group, and two aromatic rings bound to the quaternary carbon atom; or
a combination thereof.

As described above, in order for the quantum dots to be used in a color filter, a quantum dot-polymer composite pattern may be necessary. As a method of forming a pattern including quantum dots in conventional arts, U.S. Pat. No. 7,199,393, the content of which is incorporated herein in its entirety by reference, discloses that quantum dots having a photosensitive functional group on their surface are used in the patterning method. In the conventional method, a photosensitive functional group is introduced onto the surface of a quantum dot, and then is subjected to a photopolymerization, if desired together with a photopolymerizable monomer, to provide a quantum dot-polymer composite pattern. However, this method requires an additional step of a surface treatment of quantum dots, and necessarily needs the developing step using an organic solvent to form a pattern.

In order to provide an alkali-developable quantum dot pattern, when the quantum dots themselves, or the quantum dots having the organic ligand having a hydrophobic moiety as bonded to the surface are mixed with the alkali-developable photoresist without performing the surface treatment, the quantum dots have insufficient compatibility with the photoresist, so quantum dots are not dispersed and agglomerated. Furthermore, in order for the patterned quantum dot-polymer composite to be used as a color filter, a large amount of quantum dots needs to be included in the composite, but the unfavorable compatibility between the quantum dots and the photoresist may pose a substantial limit for the fabrication of a photosensitive composition including quantum dots.

In the case of the photosensitive composition according to an embodiment, quantum dots (including an organic ligand bound to the surface of the quantum dot) are preliminarily dispersed in the solution including the carboxylic acid group-containing binder to provide a quantum dot-binder dispersion liquid, and then mixed with the other components. Without wishing to be bound by any theory, it is understood that when quantum dots are dispersed in a COOH group-containing binder solution having a hydrophobic moiety, the quantum dots may readily form a dispersion due to the presence of the binder and the quantum dots dispersed by the binder may maintain their dispersed state even when they are in the photoresist composition. In addition, as the multiaromatic ring-containing polymer includes a resonance structure including a plurality of delocalized electrons together with carboxylic group (e.g., bonded with a main chain), the quantum dots may be well dispersed (i.e., separated) by the binder when the quantum dots are dispersed in the binder, and the dispersed quantum dots may maintain the dispersion even in the photoresist composition.

In an embodiment, the copolymer includes a first structural unit derived from the first monomer and a second structural unit derived from the second monomer, wherein the first structural unit may include a structural unit represented by Chemical Formula 3-1, a structural unit represented by Chemical Formula 3-2, or a combination thereof,

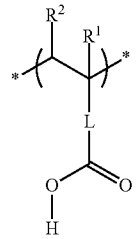

Chemical Formula 3-1 wherein in Chemical Formula 3-1,
$R^1$ is hydrogen, a C1 to C3 alkyl group, or —$(CH_2)_n$—COOH (wherein n is 0 to 2),
$R^2$ is hydrogen or a C1 to C3 alkyl group, and
L is a single bond, a C1 to C3 alkylene group, a C6 to C12 arylene group, a C6 to C30 aromatic hydrocarbon group, or a C6 to C30 alicyclic hydrocarbon group (e.g., a cycloalkylene group such as a norbornylene group),

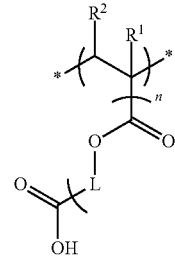

Chemical Formula 3-2 wherein Chemical Formula 3-2,
$R^1$ is hydrogen, a C1 to C3 alkyl group, or —$(CH_2)_n$—COOH (wherein n is 0 to 2),
$R^2$ is hydrogen or a C1 to C3 alkyl group,
L is a C1 to C15 alkylene group, a C1 to C15 alkylene group wherein at least one methylene group is replaced by —CO—, —O—, or —COO—, a C6 to C30 arylene group, a C6 to C30 aromatic hydrocarbon group, or a C6 to C30 alicyclic hydrocarbon group (e.g., a cycloalkylene group such as a norbornylene group), and
n is an integer ranging from 1 to 3; and the second structural unit may include a structural unit represented by Chemical Formula 4, a structural unit represented by Chemical Formula 5, a structural unit represented by Chemical Formula 6, a structural unit represented by Chemical Formula 7, or a combination thereof:

Chemical Formula 4

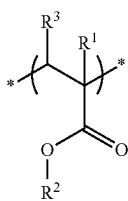

wherein Chemical Formula 4, $R^1$ is hydrogen or a C1 to C3 alkyl group, $R^2$ is a C1 to C15 aliphatic hydrocarbon group (e.g., a C1 to C15 alkyl group such as a methyl group, an ethyl group, or a propyl group), a C6 to C30 aromatic hydrocarbon group (e.g., a C6 to C24 aryl group such as a phenyl group, a naphthyl group, and the like), a C6 to C30 alicyclic hydrocarbon group (e.g., a cycloalkyl group such as a cyclohexyl group, a norbornyl group, and the like), or a C1 to C15 aliphatic hydrocarbon group (e.g., an arylalkyl group) substituted with a C6 to C30 aromatic hydrocarbon group (e.g., a C6 to C24 aryl group such as a phenyl group, a naphthyl group, and the like), or a C6 to C30 alicyclic hydrocarbon group (e.g., a cycloalkyl group such as a cyclohexyl group, a norbornyl group, and the like), and $R^3$ is hydrogen or a C1 to C3 alkyl group;

Chemical Formula 5

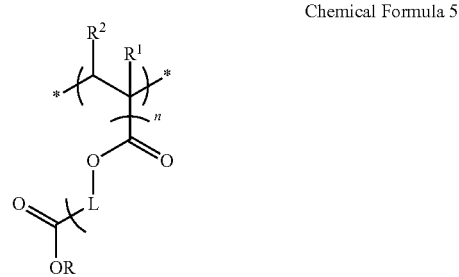

wherein $R^1$ is hydrogen or a C1 to C3 alkyl group,

L is a C1 to C15 alkylene group, a C1 to C15 alkylene group wherein at least one methylene group is replaced by —CO—, —O—, or —COO—, a C6 to C30 arylene group, a C6 to C30 aromatic hydrocarbon group, or a C6 to C30 alicyclic hydrocarbon group (e.g., a cycloalkylene group such as a norbornylene group), $R^2$ is a C1 to C15 aliphatic hydrocarbon group (e.g., a C1 to C15 alkyl group such as a methyl group, an ethyl group, or a propyl group), a C6 to C30 aromatic hydrocarbon group (e.g., a C6 to C24 aryl group such as a phenyl group, a naphthyl group, and the like), a C6 to C30 alicyclic hydrocarbon group (e.g., a cycloalkyl group such as a cyclohexyl group, a norbornyl group, and the like), or a C1 to C15 aliphatic hydrocarbon group (e.g., an arylalkyl group) substituted with a C6 to C30 aromatic hydrocarbon group (e.g., a C6 to C24 aryl group such as a phenyl group, a naphthyl group, and the like), or a C6 to C30 alicyclic hydrocarbon group (e.g., a cycloalkyl group such as a cyclohexyl group, a norbornyl group, and the like), $R^3$ is hydrogen or a C1 to C3 alkyl group, and n is an integer ranging from 1 to 3;

Chemical Formula 6

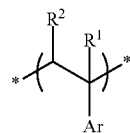

wherein in Chemical Formula 6, $R^1$ and $R^2$ are each independently hydrogen or a C1 to C3 alkyl group, and Ar is a substituted or unsubstituted C6 to C30 aryl group or a substituted or unsubstituted C6 to C30 cycloalkyl group, Chemical Formula 7

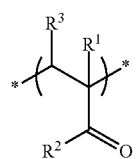

wherein in Chemical Formula 7, $R^1$ is hydrogen or a C1 to C3 alkyl group, $R^2$ is a C1 to C15 aliphatic hydrocarbon group, a C6 to C30 aromatic hydrocarbon group, a C6 to C30 alicyclic hydrocarbon group (e.g., a cycloalkyl group such as a norbornyl group), or a C6 to C30 aromatic hydrocarbon group, or a C1 to C15 aliphatic hydrocarbon group substituted with a C6 to C30 alicyclic hydrocarbon group, and $R^3$ is hydrogen or a C1 to C3 alkyl group.

The copolymer may further include a third structural unit derived from the third monomer, and the third structural unit may be represented by Chemical Formula 8:

Chemical Formula 8

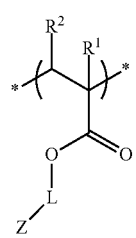

wherein in Chemical Formula 8, $R^1$ and $R^2$ are each independently hydrogen or a C1 to C3 alkyl group, L is a C1 to C15 alkylene group, a C1 to C15 alkylene group wherein at least one methylene group is replaced by —CO—, —O—, or —COO—, a C6 to C30 arylene group, a C6 to C30 aromatic hydrocarbon group, or a C6 to C30 alicyclic hydrocarbon group (e.g., a cycloalkylene group such as a norbornylene group), and Z is a hydroxy group (—OH), a mercapto group (—SH), or an amino group (—NR$_2$, wherein each R is independently hydrogen or a C1 to C15 alkyl group).

Specific examples of the first monomer may include acrylic acid, methacrylic acid, maleic acid, itaconic acid, fumaric acid, 3-butenoic acid, carboxylic acid vinyl ester compounds such as vinyl acetate, and vinyl benzoate, but are not limited thereto. The first monomer may be one or more compounds.

Specific examples of the second monomer may be alkenyl aromatic compounds such as styrene, α-methyl styrene, vinyl toluene, or vinylbenzyl methyl ether; unsaturated carbonic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; unsaturated carbonic acid amino alkyl ester compounds such as 2-aminoethyl acrylate, 2-aminoethyl methacrylate, 2-dimethylamino ethyl acrylate, or 2-dimethylaminoethyl methacrylate; maleimides such as N-phenylmaleimide, N-benzylmaleimide, N-alkylmaleimide, unsaturated carbonic acid glycidyl ester compounds such as glycidyl acrylate or glycidyl methacrylate; vinyl cyanide compounds such as acrylonitrile, or methacrylonitrile; unsaturated amide compounds such as acryl amide and methacryl amide, but are not limited thereto. As the second monomer, one or more compounds may be used.

Specific examples of the third monomer may include 2-hydroxyethyl acrylate, 2-hydroxyethyl methacrylate, 2-hydroxybutyl acrylate, 2-hydroxybutyl methacrylate, 2-aminoethyl acrylate, and 2-aminoethyl methacrylate, but are not limited thereto. As the third monomer, one or more compounds may be used.

The copolymer may be a copolymer of (meth)acrylic acid; and at least one second monomer selected from arylalkyl (meth)acrylate, hydroxyalkyl (meth)acrylate, and styrene.

In the monomer mixture of the copolymer, a content of the first monomer may be greater than or equal to about 10 mol % and less than or equal to about and 90 mol %, a content of the second monomer may be greater than or equal to about 10 mol % and less than or equal to about 90 mol %, and a content of the third monomer may be about 0 mol % to about 20 mol %.

In the multiple aromatic ring-containing polymer, the backbone structure may be represented by Chemical Formula A:

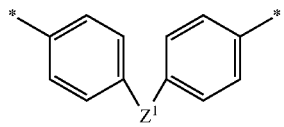

Chemical Formula A wherein in Chemical Formula A,
* indicates a portion linked to an adjacent atom of the main chain of the binder,
$Z^1$ is a linking moiety represented by any one of Chemical Formulae A-1 to A-6, and in Chemical Formulae A-1 to A-6, and wherein in Chemical Formulae A-1 to A-6, * indicates a portion linked to an aromatic moiety:

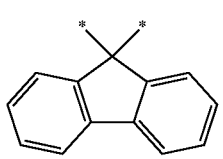

Chemical Formula A-1

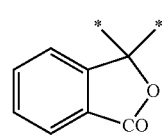

Chemical Formula A-2

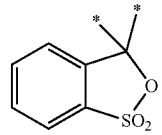

Chemical Formula A-3

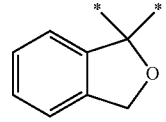

Chemical Formula A-4

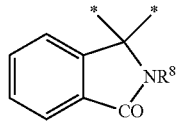

Chemical Formula A-5 wherein in Chemical Formula A-5, $R^a$ is a hydrogen atom, an ethyl group, $C_2H_4Cl$, $C_2H_4OH$, $CH_2CH=CH_2$, or a phenyl group,

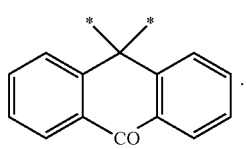

Chemical Formula A-6

The carboxylic acid group-containing binder may include a structural unit represented by Chemical Formula B:

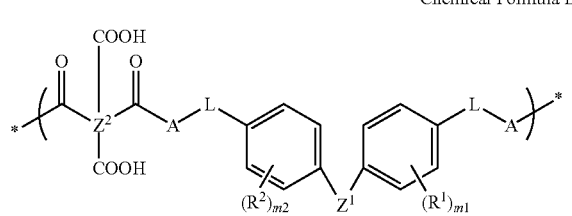

Chemical Formula B wherein Chemical Formula B,
$Z^1$ is a linking moiety represented by any one of Chemical Formulae A-1 to A-6,
L is a single bond, C1 to C10 alkylene group, a C1 to C10 alkylene having a substituent including a carbon-carbon double bond, a C1 to C10 oxyalkylene group, or a C1 to C10 oxyalkylene having a substituent including a carbon-carbon double bond,
A is —NH—, —O—, or a C1 to C10 alkylene group, and
$Z^2$ is a C6 to C40 aromatic organic group.

In Chemical Formula B, $Z^2$ may be represented by any one of Chemical Formula [2-1], Chemical Formula [2-2], and Chemical Formula [2-3]:

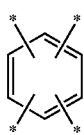

Chemical Formula B-1 wherein Chemical Formula B-1, * indicates a portion linked to an adjacent carbonyl carbon,

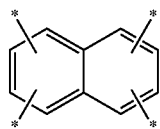

Chemical Formula B-2 wherein Chemical Formula B-2, * indicates a portion linked to an adjacent carbonyl carbon,

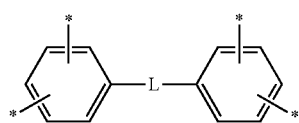

Chemical Formula B-3 wherein Chemical Formula B-3,

* indicates a portion linked to an adjacent carbonyl carbon,

L is a single bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤q≤10), —CR$_2$— (wherein R is independently, hydrogen, a C1 to C10 aliphatic hydrocarbon group, a C6 to C20 aromatic hydrocarbon group, or a C6 to C20 alicyclic hydrocarbon group), -C(CF$_3$)$_2$—, —C(CF$_3$)(C$_6$H$_5$)—, or —C(=O)NH—.

The multiple aromatic ring-containing polymer may include a structural unit represented by Chemical Formula C;

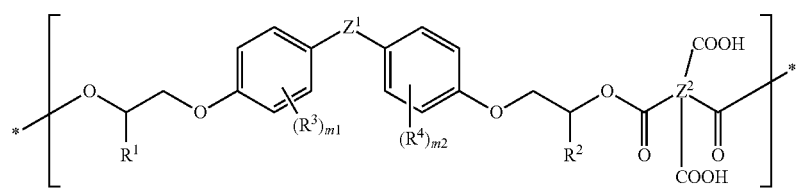

Chemical Formula C wherein in Chemical Formula C, $R^1$ and $R^2$ are each independently a hydrogen atom or a substituted or unsubstituted (meth)acryloyloxyalkyl group, $R^3$ and $R^4$ are each independently a hydrogen atom, a halogen atom or a substituted or unsubstituted C1 to C20 alkyl group, $Z^1$ is a moiety selected from linking moieties represented by Chemical Formulae A-1 to A-6, $Z^2$ is an aromatic organic group, and m1 and m2 are each independently an integer ranging from 0 to 4.

The multiple aromatic ring-containing polymer may be an acid adduct of bisphenol fluorene epoxy acrylate.

The multiple aromatic ring-containing polymer may include a functional group represented by Chemical Formula D at one or both of the terminal ends thereof:

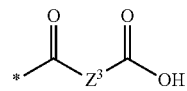

Chemical Formula D

In Chemical Formula D, $Z^3$ is a moiety represented by one of Chemical Formulae D-1 to D-7:

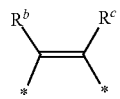

Chemical Formula D-1 wherein $R^b$ and $R^c$ are each independently a hydrogen atom, a substituted or unsubstituted C1 to C20 alkyl group, an ester group, or an ether group.

Chemical Formula D-2

Chemical Formula D-3

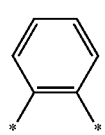

Chemical Formula D-4

-continued

Chemical Formula D-5 wherein $R^d$ is O, S, NH, a substituted or unsubstituted C1 to C20 alkylene group, a C1 to C20 alkylamine group, or a C2 to C20 alkenylamine group.

Chemical Formula D-6

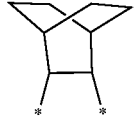

Chemical Formula D-7

The multiple aromatic ring-containing polymer may be synthesized by a known method or may be commercially available (e.g., from Nippon Steel Chemical Co., Ltd.).

As a non-limiting example, the multiple aromatic ring-containing polymer may be an acid adduct of bisphenolfluorene epoxy acrylate. The multiple aromatic ring-containing polymer may be a reaction product of 9,9-bis(4-hydroxyphenyl)fluorene, 9,9-bis(4-aminophenyl)fluorene, 9,9-bis[4-(glycidyloxy)phenyl]fluorene, 9,9-bis[4-(2-hydroxyethoxy) phenyl]fluorene and aromatic dianhydrides selected from 9,9-bis-(3,4-dicarboxyphenyl)fluorene dianhydrides, pyromellitic dianhydride (PDMA), biphenyltetracarboxylic dianhydrides (BPDA), benzophenol tetracarboxylic dianhydrides, and naphthalene tetracarboxylic dianhydrides. The fluorene compound and dianhydrides may be commercially available, and condition for the reactions therebetween may be known.

The carboxylic acid group-containing binder quantum dot may have an acid value of greater than or equal to about 50 milligrams of KOH per gram of the binder (mg KOH/g) in order to disperse quantum dots, even though it may be different depending on a chemical structure of the binder (e.g., a chemical structure of a hydrophobic moiety in a main chain or a side chain of the binder). For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the carboxylic acid group-containing binder may be, for example, less than or equal to about 200 mg KOH/g, for example, less than or equal to about 190 mg KOH/g, less than or equal to about 180 mg KOH/g, or less than or equal to about 160 mg KOH/g, but is not limited thereto. The quantum dot may be mixed with a binder-containing solution having an acid value within the ranges and thereby form a quantum dot-binder dispersion. The formed quantum dot-binder dispersion may show improved compatibility with the other components of a photoresist (e.g., a photopolymerizable monomer, a photoinitiator, a solvent, and the like that will be described later) to such extent that the quantum dots may be dispersed in a final composition (i.e., photoresist composition) to be patternable. In an embodiment, the carboxylic acid group-containing binder may have an acid value of about 100 mg KOH/g to about 200 mg KOH/g.

The carboxylic acid group-containing binder may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The carboxylic acid group-containing binder may have a weight average molecular weight of less than or equal to about 100,000 g/mol, for example, less than or equal to about 50,000 g/mol. Within the above ranges, developability may be ensured.

In the photosensitive composition, a content of the carboxylic acid group-containing binder may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on the total amount of the composition. The content of the carboxylic acid group-containing binder may be less than or equal to about 40 wt %, for example, less than or equal to about 30 wt % based on the total amount of the composition. Within the above ranges, an appropriate developability and processibility during a post pattern forming process may be realized while ensuring good dispersion of quantum dots.

The photosensitive composition according to an embodiment includes a photopolymerizable monomer having a carbon-carbon double bond.

The photopolymerizable monomer may be a mixture of a photopolymerizable monomer having at least one carbon-carbon double bond (e.g., a vinyl group or a (meth)acrylate group). In an embodiment, the mixture of the photopolymerizable monomer may include a main monomer having 1 to 6 (meth)acrylate groups, optionally at least one of a first auxiliary monomer having 8 to 20 carbon-carbon double bonds (e.g., a (meth)acrylate group) and a second auxiliary monomer represented by Chemical Formula 1:

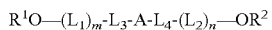   Chemical Formula A wherein

A is a C1 to C40 aliphatic hydrocarbon group such as methylene, ethylene, propylene, or butylene, a C6 to C40 aromatic hydrocarbon group such as phenylene or naphthalene (e.g., an arylene moiety), —O— (an ether group), or a moiety including at least two C6 to C40 aromatic hydrocarbon groups linked by a substituted or unsubstituted C1 to C10 alkylene group, an ether group, or a combination thereof such as a biphenylene group or a bisphenyl alkylene group. At least one methylene of the C1 to C40 aliphatic hydrocarbon group may be replaced by an ether group, an ester group, or a combination thereof.

$L_1$ and $L_2$ are the same or different, and are each a C2 to C5 substituted or unsubstituted oxyalkylene group, for example, —O(CR$_2$)$_n$— or —(CR$_2$)$_n$O—(wherein each R is independently hydrogen or a methyl group, and n is 1 to 5).

The m and n are each an integer ranging from 0 to 20, provided that m and n are not simultaneously 0. In an embodiment, a sum of m and n may be 1 to 20.

$L_3$ and $L_4$ are the same or different, and are each a single bond, O—(CH$_2$)$_n$—CH(OH)—CH$_2$—(wherein n is an integer of 1 to 5), or —(CH$_2$)$_n$—CH(OH)—CH$_2$-(wherein n is an integer of 1 to 5).

$R^1$ and $R^2$ are the same or different, and are each independently CR$_2$=CR— (wherein R is hydrogen or a methyl group) or CR$_2$=CRC(=O)—(wherein R is hydrogen or a methyl group).

The main monomer having 1 to 6 (meth)acrylate groups is a main component constituting a cured polymer of a quantum dot-polymer composite pattern, and is a photopolymerizable monomer.

The main monomer is not particularly limited, and may be, for example, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, trimethylolpropane tri(meth)acrylate, ethylene glycol monomethyl ether (meth)acrylate, novolac epoxy (meth)acrylate, diethylene glycol di(meth)acrylate, triethylene glycol di(meth)acrylate, propylene glycol di(meth)acrylate, tris(meth)acryloyloxyethyl phosphate, or a combination thereof, but is not limited thereto.

When the first auxiliary monomer and/or the second auxiliary monomer are used, developability and linearity of a pattern may be ensured, even with the presence of a large amount of quantum dots and inorganic light diffusing agent.

The first auxiliary monomer may have 8 or more of a carbon-carbon double bonds (e.g., a (meth)acrylate group), for example, 10 or more carbon-carbon double bonds, or 12 or more carbon-carbon double bonds. The first auxiliary monomer may have 20 or less of a carbon-carbon double bonds.

Without being bound by any particular theory, the first auxiliary monomer increases the number of a cross-linkable functional group and the functional group effectively participates in a cross-linking reaction, thereby improving linearity due to improvement of pattern density.

The first auxiliary monomer may be a hyperbranched acrylate monomer. The hyperbranched monomer may have a regularly branched shape, like a dendrimer. Alternatively, the hyperbranched monomer may have an incompletely branched or irregular structure. The first auxiliary monomer may further include one or more (e.g., 1 to 4) hydroxy groups, and pattern density and developability may be improved together. The first auxiliary monomer may be used alone or in a mixture of 2 monomers or more.

A weight average molecular weight of the first auxiliary monomer may be greater than or equal to about 300 g/mol, for example, about 300 g/mol to about 10,000 g/mol, or about 500 g/mol to about 800 g/mol.

The first auxiliary monomer may be synthesized by a known method or may be commercially available (e.g., Shin-Nakamura Chemical Co., Ltd. or Nippon Kayaku Co., Ltd.).

The second auxiliary monomer may be represented by Chemical Formula A. For example, the second auxiliary monomer may be represented by one of Chemical Formula A-1 and Chemical Formula A-2:

Chemical Formula A-1

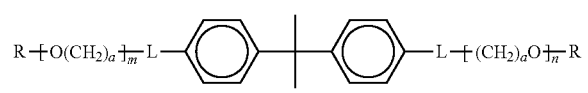

Chemical Formula A-2

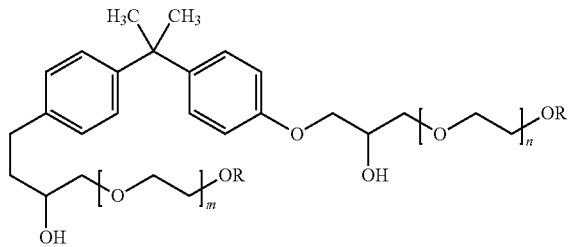

wherein in Chemical Formula A-1 and A-2,

R is the same or different, and are each independently —COCR=CR$_2$ (R is hydrogen or a methyl group), a is an integer ranging from 1 to 5, m and n are the same as defined in Chemical Formula A, and L is the same or different, and is each independently a single bond, a C1 to C10 alkylene group, or —O—.

For example, the second auxiliary monomer may include bisphenol A ethylene glycol di(meth)acrylate, bisphenol A ethoxylate di(meth)acrylate, poly(ethylene glycol) reacted with bisphenol A glycidyl ether, bisphenol A di(meth)acrylate, bisphenol A epoxyacrylate, or a combination thereof.

A weight average molecular weight of the second auxiliary monomer may be greater than or equal to about 300 g/mol, for example, about 300 g/mol to about 10,000 g/mol, or about 700 g/mol to about 1,500 g/mol.

In the photopolymerizable monomer mixture, a content of the main monomer may be greater than or equal to about 60 wt %, for example, greater than or equal to about 65 wt %, based on the total weight of the photopolymerizable monomer mixture. The content of the main monomer may be less than or equal to about 90 wt %, for example, less than or equal to about 85 wt %, based on the total weight of the photopolymerizable monomer mixture.

In the photopolymerizable monomer mixture, a sum of the first auxiliary monomer and the second auxiliary monomer may be greater than or equal to about 10 wt %, for example, greater than or equal to about 15 wt %, based on the total weight of the photopolymerizable monomer mixture. In the photopolymerizable monomer mixture, a sum of the first auxiliary monomer and the second auxiliary monomer may be less than or equal to about 40 wt %, for example, less than or equal to 35 wt %, based on the total weight of the photopolymerizable monomer mixture.

In the photopolymerizable monomer mixture, a ratio between the amount of the first auxiliary monomer and the amount of the second auxiliary monomer may be about 1:0.1 to about 1:10, for example, about 1:0.2 to 1:5, or about 1:0.25 to 1:4, about 1:0.5 to 1:2, about 1:0.7 to 1:1.3, or about 1:0.75 to 1:1.2, but is not limited thereto. In another embodiment, a content of the first auxiliary monomer is the same as or greater than the content of the second auxiliary monomer, but is not limited thereto.

In the photosensitive composition, a content of the photopolymerizable monomer may be greater than or equal to about 0.5 wt %, for example, greater than or equal to about 1 wt %, or greater than or equal to about 2 wt %, based on the total weight of the composition. The content of the photopolymerizable monomer may be less than or equal to about 20 wt %, for example, less than or equal to about 10 wt %, based on the total weight of the composition.

A photosensitive composition according to an embodiment may further include a reactive compound having at least two thiol groups.

The reactive compound may have a structure of Chemical Formula 2:

Chemical Formula 2

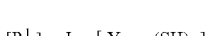

wherein in Chemical Formula 2,

R$^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —NH$_2$; a substituted or unsubstituted C1 to C30 amine group (—NRR', wherein R and R' are each independently hydrogen or a C1 to C30 linear or branched alkyl group); an isocyanate group; a halogen; -ROR' (wherein R is a substituted or unsubstituted C1 to C20 alkylene group and R' is hydrogen or a C1 to C20 linear or branched alkyl group); an acyl halide (-RC(=O)X, wherein R is a substituted or unsubstituted alkylene group and X is a halogen); —C(=O)OR' (wherein R' is hydrogen or a C1 to C20 linear or branched alkyl group); —CN; or —C(=O)ONRR' (wherein R and R' are each independently hydrogen or a C1 to C20 linear or branched alkyl group), L$_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one of non-adjacent methylene (—CH$_2$—) groups of the substituted C1 to C30 alkylene group may be replaced by a sulfonyl group (—SO$_2$—), a carbonyl group (—CO—), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or a combination thereof, Y$_1$ is a single bond; a substituted or unsubstituted C1 to C30 alkylene group; a substituted or unsubstituted C2 to C30 alkenylene group; a substituted C1 to C30 alkylene group or a C2 to C30 alkenylene group wherein at least one methylene (—CH$_2$—) group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, m is an integer of 1 or more,
k1 is 0 or an integer of 1 or more,
k2 is an integer of 1 or more, and
a sum of m and k2 is an integer of 3 or more,
provided that when Y$_1$ is not a single bond, m does not exceed the valence of Y$_1$, and provided that a sum of k1 and k2 does not exceed the valence of L$_1$.

The reactive compound may include a compound represented by Chemical Formula 2-1:

Chemical Formula 2-1

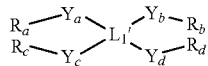

wherein in Chemical Formula 2-1,

L$_1$' is carbon, a substituted or unsubstituted C2 to C20 alkylene group, a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, Y$_a$ to Y$_d$ are each independently a single bond; a substituted or unsubstituted C1 to C30 alkylene group; a substituted or unsubstituted C2 to C30 alkenylene group; or a C1 to C30 alkylene group or C2 to C30 alkenylene group wherein at least one methylene (—CH$_2$—) group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, and R$_a$ to R$_d$ is R$^1$ or SH of Chemical Formula 2, provided that at least two of R$^a$ to R$_d$ are SH.

The reactive compound may react with a photopolymerizable monomer, which will be described below, without causing adverse effects on the dispersion of quantum dots, and thereby may prevent the quantum dots dispersed in the pattern from suffering deterioration of luminous efficiency due to the heat treatment (e.g., post-baking), which may be accompanied by the photoresist process. Without wishing to be bound by any theory, it is believed that the reactive compound may further react with the photopolymerizable monomer, thereby allowing a pattern forming polymer to make a denser network. In addition, the reactive compound may provide a bond between the quantum dot and the photopolymerizable monomer to ensure the dispersion and the stability. In particular, the luminous properties (e.g., characteristics of maintaining the blue-photo-conversion rate) of the pattern formed from the photosensitive polymer composition including such reactive compounds may increase even by at least two times compared to the composition having no reactive compound. In an embodiment, the photosensitive composition may maintain a blue photo-conversion rate that is greater than or equal to about 40% of the initial value even after being developed by an alkali aqueous solution, dried, and then heated at 180° C. for 30 minutes.

However, the addition of such a reactive compound (e.g. a thiol compound) may increase the curing reaction rate in the photo-curing step, and thereby increase the curing rate difference between the upper part and the lower part of the pattern, thus becoming a cause of a serious undercut phenomenon. The composition according to an embodiment may suppress/prevent the undercut phenomenon by using a mixture of the first photoinitiator and the second photoinitiator as a photoinitiator.

The reactive compound may include a dithiol compound, a trithiol compound, a tetrathiol compound, or a combination thereof. For example, the reactive compound may include glycol di-3-mercaptopropionate, glycol dimercapto acetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol structural units, or a combination thereof.

When the reactive compound is present, a content of the reactive compound may be greater than or equal to about 0.1 wt %, for example, greater than or equal to about 0.5 wt %, or greater than or equal to about 1 wt %, based on the total weight of the composition. The content of the reactive compound may be less than or equal to about 40 wt %, for example, less than or equal to about 20 wt %, less than or equal to about 10 wt % or less than or equal to about wt %, based on the total weight of the composition. Within the above ranges, patternability and stability may be further improved.

If desired, the photosensitive composition may further include various additives such as a light diffusing agent, a leveling agent, or a coupling agent, in addition to the aforementioned components. The amount of the additive is not particularly limited and may be varied within an appropriate range, wherein the additive does not make an adverse effect on the photosensitive composition and the pattern obtained therefrom.

The light diffusing agent may increase a refractive index of the composition in order to increase a chance of the incident light to meet with quantum dots. The light diffusing agent may include inorganic oxide particles such as alumina, silica, zirconia, titanium oxide particulates, or zinc oxide, and metal particles such as gold, silver, copper, or platinum, but is not limited thereto.

The leveling agent is aimed to prevent stains or spots and to improve planarization and leveling characteristics of a film. Examples of the leveling agent may include the following but are not limited thereto.

A fluorine leveling agent may include commercially available products, for example BM-1000©, and BM-1100© (BM Chemie Inc.); MEGAFACE F 142D®, F 172©, F 173©, and F 183© of Dainippon Ink Kagaku Kogyo Co., Ltd.; FC-135©, FC-170C®, FC-430®, and FC-431® of Sumitomo 3M Co., Ltd.; SURFLON S-112©, SURFLON S-113©, SURFLON S-131©, SURFLON S-141®, and SURFLON S-145© of Asahi Glass Co., Ltd.); and SH-28PA®, SH-190©, SH-193©, SZ-6032©, and SF-8428©, and the like of Toray Silicone Co., Ltd.).

The coupling agent is aimed to increase adherence with a pattern and glass and resolution, and examples thereof may include a silane coupling agent. Examples of the silane coupling agent may include, but are not limited thereto, vinyl trimethoxysilane, vinyl tris(2-methoxyethoxysilane), 3-glycidoxypropyl trimethoxysilane, 2-(3,4-epoxycyclohexyl)ethyl trimethoxysilane, 3-chloropropylmethyl dimethoxysilane, 3-chloropropyl trimethoxysilane, 3-methacryloxypropyl trimethoxysilane, 3-mercaptopropyl trimethoxysilane, and the like.

Types and amounts of the additives may be adjusted if desired.

The photosensitive composition includes a solvent. An amount of the solvent may be determined depending on the amounts of the main components (i.e., organic ligand-containing quantum dots, a COOH group-containing binder, a reactive compound, a photopolymerizable monomer, and a photoinitiator) and other additives. The composition may include the solvent in such an amount that the rest amount of the composition, other than the amounts of the solid (i.e., non-volatiles) components, is the amount of the solvent. The solvent may be selected appropriately depending on its affinity for other components (e.g., the binder, the photopolymerizable monomer, the photoinitiator, and other additives), its affinity for alkali developing solution, and its boiling point. Examples of the solvent may include, but are not limited to, an ethylene glycol such as ethyl 3-ethoxypropionate, ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; a glycol ether acetate such as ethylene glycol acetate, ethylene glycol monoethyl ether acetate, diethylene glycol monoethyl ether acetate, or diethylene glycol monobutyl ether acetate; a propylene glycol such as propylene glycol; a propylene glycol ether such as propylene glycol monomethyl ether, propylene glycol monoethyl ether, propylene glycol monopropyl ether, propylene monobutyl ether, propylene glycol dimethyl ether, dipropylene glycol dimethyl ether, propylene glycol diethyl ether, or dipropylene glycol diethyl ether; a propylene glycol ether acetates such as propylene glycol monomethyl ether acetate, or dipropylene glycol monoethyl ether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum hydrocarbons such as toluene, xylene, or solvent naphtha; an ester such as ethyl acetate, butyl acetate, or ethyl lactate; an ether such as diethyl ether, dipropyl ether, and dibutyl ether; and a combination thereof.

A method of preparing a photosensitive composition according to an embodiment includes:
preparing a binder solution including the carboxylic acid group (—COOH)-containing binder and the solvent;
dispersing the plurality of quantum dots including an organic ligand on their surfaces in the binder solution to obtain a quantum dot-binder dispersion; and
mixing (combining) the quantum dot-binder dispersion with at least one of the photoinitiator; the photopolymerizable monomer; and the solvent.

A mixing method is not particularly limited and may be appropriately selected. For example, each component may be mixed sequentially or simultaneously.

The method of preparing a photosensitive composition may further include selecting a quantum dot including an organic ligand having a hydrophobic moiety on the surface thereof, and selecting a carboxylic acid group-containing binder capable of dispersing the quantum dot. In the step of selecting the binder, the binder may be a carboxylic acid group-containing binder, the carboxylic acid group-containing binder may be a copolymer of the monomer mixture including the first monomer having a carboxylic acid group and a carbon-carbon double bond and the second monomer having a carbon-carbon double bond and a hydrophobic moiety and not having a carboxylic acid group, and chemical structure and acid values of the copolymer may be considered.

Details of the quantum dot, the carboxylic acid group-containing binder, the photopolymerizable monomer, and the photoinitiator are the same as set forth above.

The photosensitive composition may be developed with an alkaline aqueous solution, and thus, when the photosensitive composition is used, a quantum dot-polymer composite pattern may be patterned without using an organic solvent developing solution.

A non-limiting method of forming a pattern is explained in reference to FIG. 1.

First, the photosensitive composition is coated on a predetermined substrate (e.g., a glass substrate or a glass substrate coated with a predetermined thickness of $SiN_x$ (protective layer) (e.g., 500 to 1,500 Å of the protective layer)) in an appropriate manner such as a spin coating, a slit coating and the like to form a film of a predetermined thickness (e.g., thickness of 3 to 30 μm). The formed film may be pre-baked, if desired. The specific conditions of pre-baking such as a temperature, time, and atmosphere are known in the art and may be selected appropriately.

The formed (or, optionally pre-baked) film is exposed to light having a predetermined wavelength under a mask having a predetermined pattern. The wavelength and the intensity of light may be selected depending on the types and the amounts of the photoinitiator, and the types and the amounts of the quantum dot or the like.

The exposed film is treated with an alkali developing solution, and thereby the unexposed region in the film is dissolved to provide a desirable pattern. The obtained pattern may be post-baked, if desired, to improve the crack resistance and the solvent resistance of the pattern, for example, at a temperature of about 150° C. to about 230° C.

for a predetermined time (e.g., greater than or equal to about 10 minutes or greater than or equal to about 20 minutes). Even when the post-bake step is performed, the pattern obtained from the photosensitive composition has improved thermal stability, so that the light conversion rate may be maintained at greater than or equal to about 40% of the initial value.

When a quantum dot-polymer composite obtained from the photosensitive composition is used as a color filter, two or three types of photosensitive compositions including a red quantum dot, a green quantum dot, (or optionally, a blue quantum dot) are prepared, and the patterning process is repeated for each composition to provide a quantum dot-polymer composite having a desirable pattern.

When the quantum dot-polymer composite obtained from the photosensitive composition is used as a color filter, two types of photosensitive composition including a red quantum dot and a green quantum dot are prepared, and the patterning process is repeated for each composition to provide a quantum dot-polymer composite having a desirable pattern.

Accordingly, another embodiment provides a quantum dot-polymer composite pattern obtained from the photosensitive composition. The quantum dot polymer composite pattern includes:

a polymerization product of a plurality of quantum dots including an organic ligand on their surfaces; a carboxylic acid group (—COOH)-containing binder; and photopolymerizable monomer (or optionally the photopolymerizable monomer and the reactive compound having at least two thiol groups), wherein the plurality of quantum dots are dispersed (e.g., separated from each other without agglomeration) in the carboxylic acid group (—COOH)-containing binder and the polymerization product.

The quantum dot, the carboxylic acid group (—COOH)-containing binder, the photopolymerizable monomer, and the reactive compound are the same as described above.

Hereinafter, the embodiments are illustrated in more detail with reference to examples. However, they are exemplary embodiments of the present disclosure are not limited thereto.

EXAMPLES

Comparative Example 1

[1] Preparation of Quantum Dot-Binder Dispersion Liquid

A chloroform dispersion of green quantum dot (green light emitting, composition: InP/ZnS) including oleic acid as a hydrophobic organic ligand on the surface is prepared. The chloroform dispersion including 50 grams (g) of quantum dot (green) including oleic acid as a hydrophobic organic ligand on the surface (converted from the optical density) is mixed with 100 g of a binder (quaternary copolymer of acrylic acid, benzyl methacrylate, hydroxyethyl methacrylate, and styrene, acid value: 130 milligrams of KOH per gram (mg KOH/g), weight average molecular weight: 8,000, acrylic acid: benzyl methacrylate: hydroxyethyl methacrylate: styrene (molar ratio)=61.5%:12%:16.3%:10.2%) solution (polypropylene glycol monomethyl ether acetate having a concentration of 30 wt %) to provide a quantum dot-binder dispersion. It is determined that quantum dots are uniformly dispersed in the quantum dot-binder dispersion.

[2] Preparation of Photosensitive Composition

To the quantum dot binder dispersion liquid obtained from [1], glycol di-3-mercaptopropionate (hereinafter, 2T) having the following chemical structure, a photopolymerizable monomer of hexaacrylate having the following structure, an initiator of oxime ester compound (trade name: PBG305, manufacturer: Changzhou Tronly New Electronic Materials Co., Ltd.), a light diffusing agent of $TiO_2$ and PGMEA are mixed to provide a photosensitive composition.

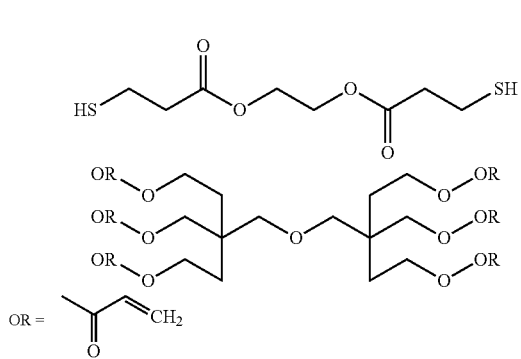

Figure 2:
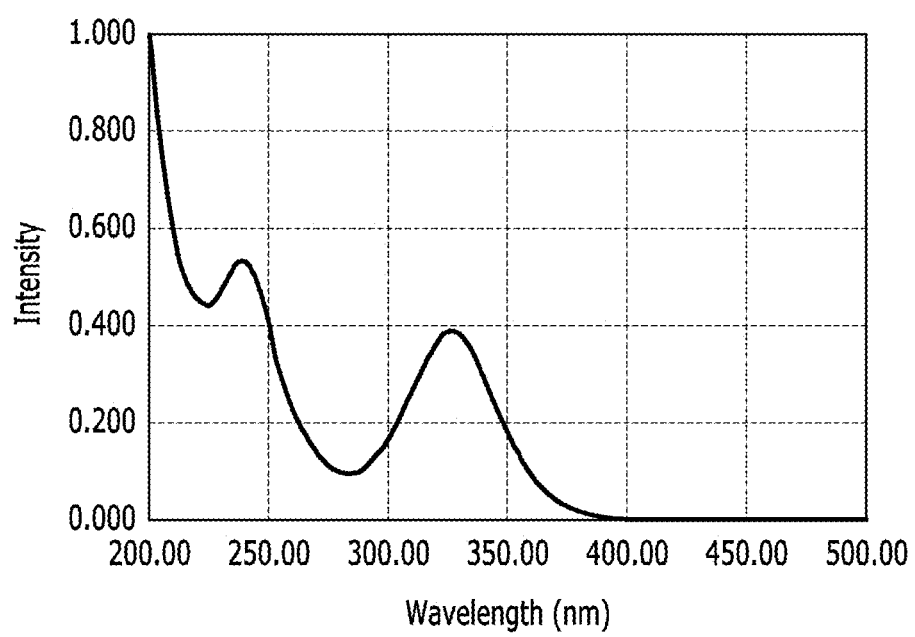
FIG. 2 is a graph of normalized intensity versus wavelength (nanometers, nm) showing a UV-visible absorption spectrum of an initiator of PBG305.

The oxime ester compound has a $\lambda_{max}$ of 331 nm, and its light absorption spectrum is shown in FIG. 2.

It is determined that the obtained photosensitive composition forms a dispersion liquid without generating an agglomeration caused by adding quantum dots. Based on the total weight of the obtained photosensitive composition, it includes the organic ligand-included quantum dots in 12 wt %, the photoinitiator in 0.2 wt %, the photopolymerizable monomer in 1 wt %, the thiol group-included reactive compound in 15 wt %, the light diffusing agent in 15 wt % and the solvent as the balance.

[3] Preparation of Quantum Dot-Polymer Composite Pattern

The photosensitive composition obtained from [2] is spin-coated on a glass substrate to provide a film. The obtained film is pre-baked at 100° C. The blue-photo-conversion rate of the pre-baked film is measured, and the results are shown in the following Table 1. The pre-baked film is irradiated with light (wavelength: 365 nm, intensity: 100 milliJoules, mJ) for one second under a mask having a predetermined pattern and developed by a potassium hydroxide aqueous solution (concentration: 0.043 wt %) for 90 seconds. After the development, it is post-baked at 180° C. for 30 minutes to provide a pattern.

Figure 3:
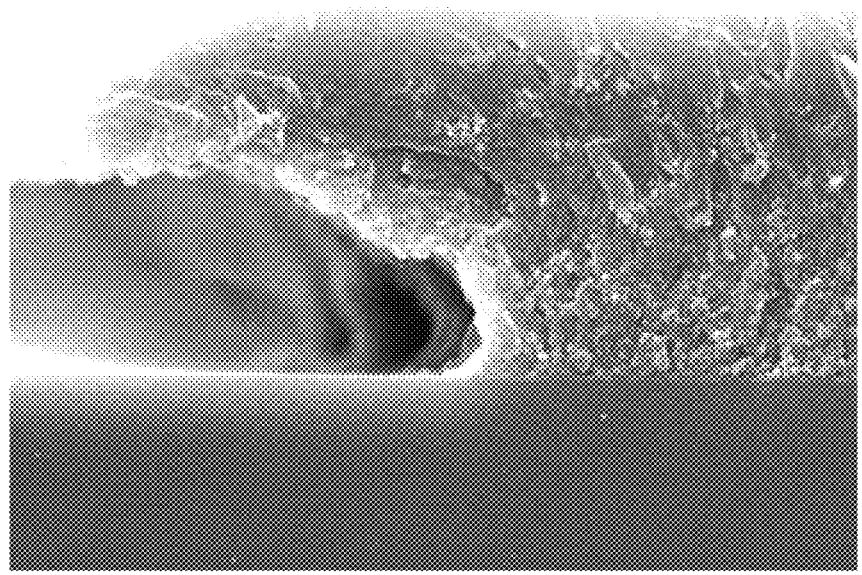
FIG. 3 is an image showing a cross-sectional shape of the pattern obtained from Comparative Example 1.

FIG. 3 is a photograph showing a cross-section of the obtained pattern.

As shown in FIG. 3, it is determined that the composition according to Comparative Example 1 provides a pattern having a serious undercut.

Comparative Example 2

A photosensitive composition is prepared in accordance with the same procedure as in Comparative Example 1, and a quantum dot-polymer composite pattern is obtained in accordance with the same procedure as in Comparative Example 1, except that 0.2 wt % of an initiator including a phosphine oxide compounds (mixture of TPO+Irgacure 819, Irgacure 2100, manufacturer: Yuwon Intec, BASF) having the following structure are used as a photoinitiator:

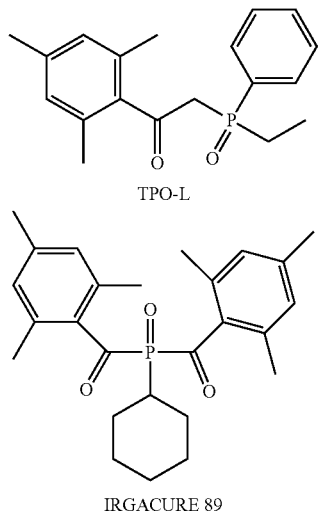

TPO-L

IRGACURE 89

The initiator of Irgacure 2100 has a $\lambda_{max}$ of 375 nm. (The TPO-L has a $\lambda_{max}$ of 375 nm; the Irgacure 819 has a $\lambda_{max}$ of 370 nm).

Figure 4:
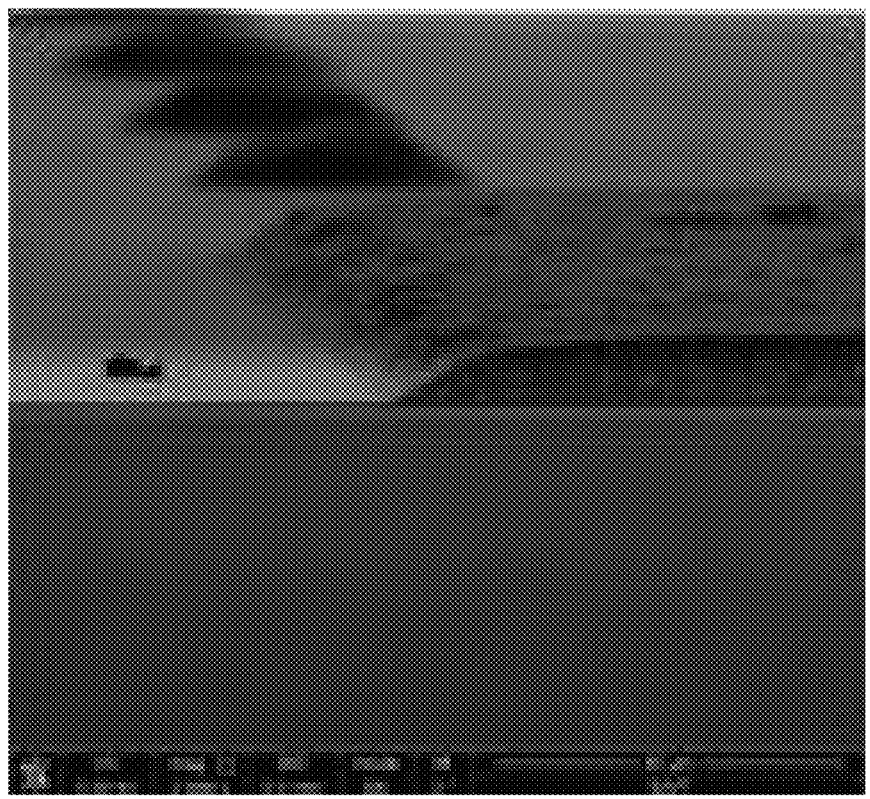
FIG. 4 is an image showing a cross-sectional shape of the pattern obtained from Comparative Example 2.

FIG. 4 is a photograph showing a cross-section of the obtained pattern. The results of FIG. 4 confirm that using only Irgacure 2100 results in a poor patterning property.

Example 1

A photosensitive composition and a quantum dot-polymer composite pattern are prepared in accordance with the same procedure as in Comparative Example 1, except that a mixture of PBG 305 and Irgacure 2100 in a weight ratio of 1:1 are used as a photoinitiator and the total amount of photoinitiator is 0.2 wt %.

Figure 6:
FIG. 6 is an image showing a cross-sectional shape of the pattern obtained from Example 1.

FIG. 6 is a photograph showing a cross-section of the obtained pattern. As shown in FIG. 6, it is confirmed that the pattern has significantly improved shape compared to Comparative Example 1.

Comparative Example 3

A photosensitive composition and a quantum dot-polymer composite pattern are prepared in accordance with the same procedure as in Comparative Example 1, except that 0.2 wt % of initiator (Irgacure 369, manufacturer: BASF) having the following structure is used as a photoinitiator:

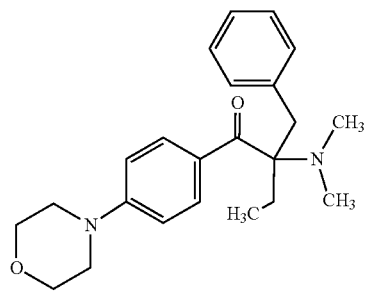

The initiator of Irgacure 369 has a $\lambda_{max}$ of 321 nm.

Figure 5:
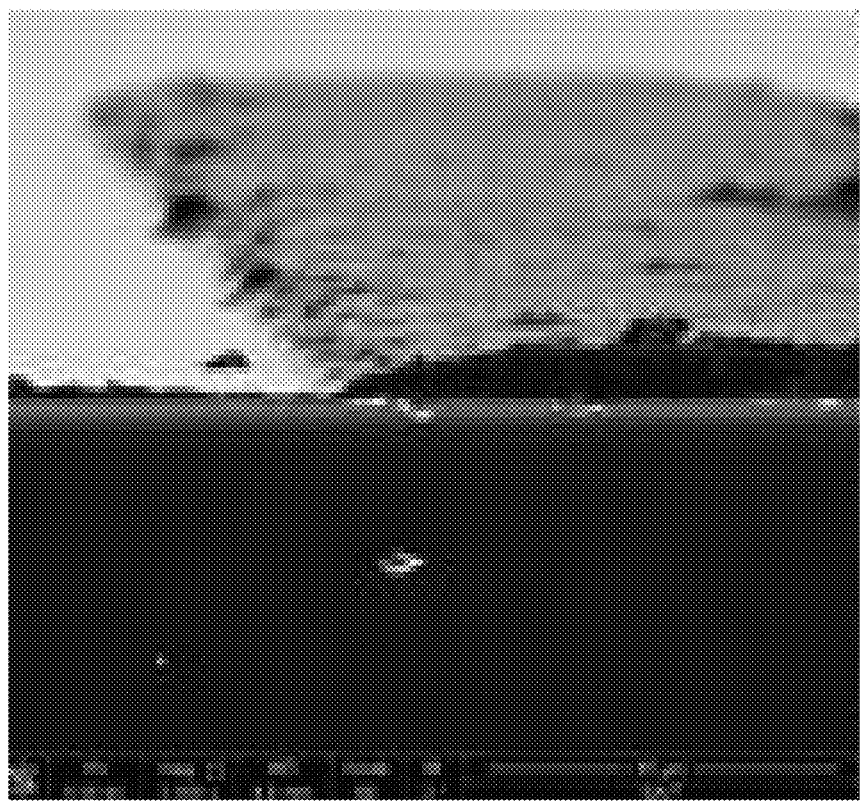
FIG. 5 is an image showing a cross-sectional shape of the pattern obtained from Comparative Example 3.

FIG. 5 is a photograph showing a cross-section of the obtained pattern.

The results of FIG. 4 confirm that using only Irgacure 369 results in a poor patterning property.

Example 2

A photosensitive composition and a quantum dot-polymer composite pattern are prepared in accordance with the same procedure as in Comparative Example 1, except that a mixture of PBG 305 and Irgacure 369 in a weight ratio of 1:1 is used as a photoinitiator, and the total amount of photoinitiator is 0.2 wt %.

Figure 7:
FIG. 7 is an image showing a cross-sectional shape of the pattern obtained from Example 2.

FIG. 7 is a photograph showing a cross-section of the obtained pattern. The results of FIG. 7 confirm that the pattern has significantly improved shape compared to Comparative Example 1.

Example 3

A photosensitive composition and a quantum dot-polymer composite pattern are prepared in accordance with the same procedure as in Comparative Example 1, except that a mixture of PBG 305 and Irgacure 369 in a weight ratio of 6:4 is used as a photoinitiator, and the total amount of photoinitiator is 0.2 wt %.

Figure 8:
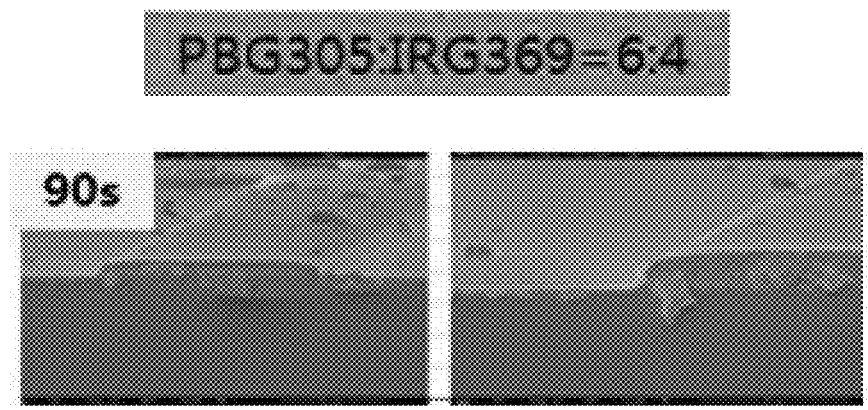
FIG. 8 is an image showing a cross-sectional shape of the pattern obtained from Example 2.

FIG. 8 is a photograph showing a cross-section of the obtained pattern.

The results of FIG. 8 confirm that the pattern having significantly improved shape compared to Comparative Example 1 may be obtained.

Example 4

A photosensitive composition and a quantum dot-polymer composite pattern are prepared in accordance with the same procedure as in Comparative Example 1, except that a mixture of PBG 305 and Irgacure 369 in a weight ratio of 8:2 is used as a photoinitiator and the total amount of photoinitiator is 0.2 wt %.

Figure 9:
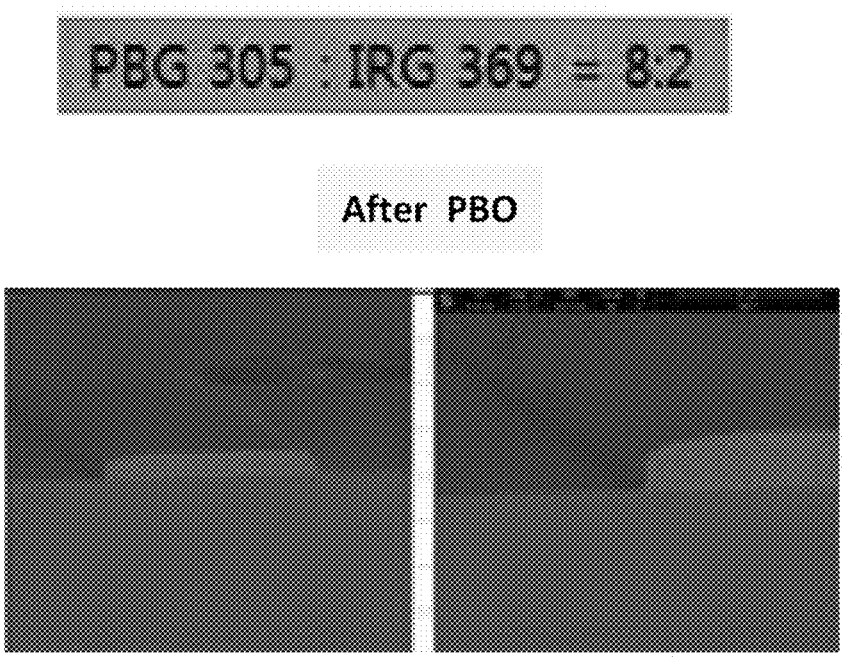
FIG. 9 is an image showing a cross-sectional shape of the pattern obtained from Example 4.

FIG. 9 is a photograph showing a cross-section of the obtained pattern.

The results of FIG. 9 confirm that the pattern having a significantly improved shape compared to Comparative Example 1 may be obtained.

While this disclosure has been described in connection with what is presently considered to be practical exemplary embodiments, it is to be understood that the disclosure is not limited to the present embodiments, but, on the contrary, is intended to cover various modifications and equivalent arrangements included within the spirit and scope of the appended claims.

What is claimed is:

1. A color filter comprising a substrate and a quantum dot-polymer composite pattern disposed on the substrate,
   wherein the quantum dot-polymer composite pattern comprises a first quantum dot polymer composite,
   wherein the first quantum dot polymer composite is configured to emit a first light and comprises a polymerization production of a first photosensitive composition comprising:
   a plurality of first quantum dots being configured to emit the first light;

a photoinitiator system;
a polymer comprising a carboxylic acid group and
a photopolymerizable monomer comprising a carbon-carbon double bond,
wherein the photoinitiator system comprises a first photoinitiator comprising an oxime compound and a second photoinitiator comprising a phosphine oxide compound, an amino ketone compound, or a combination thereof, and
wherein the first photosensitive composition further comprises a reactive compound comprising at least two thiol groups and represented by Chemical Formula 2:

Chemical Formula 2

wherein in Chemical Formula 2,
$R^1$ is selected from hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —NH$_2$; a substituted or unsubstituted C1 to C30 amine group (—NRR', wherein R and R' are each independently hydrogen or a C1 to C30 linear or branched alkyl group); an isocyanate group; a halogen; -ROR' (wherein R is a substituted or unsubstituted C1 to C20 alkylene group and R' is hydrogen or a C1 to C20 linear or branched alkyl group); acyl halide (-RC(=O)X, wherein R is a substituted or unsubstituted alkylene group and X is a halogen); —C(=O)OR' (wherein R' is hydrogen or a C1 to C20 linear or branched alkyl group); —CN; or —C(=O)ONRR' (wherein R and R' are each independently hydrogen or a C1 to C20 linear or branched alkyl group),
$L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one of non-adjacent methylene (—CH$_2$—) groups of the substituted C1 to C30 alkylene group is replaced by a sulfonyl group (—SO$_2$—), a carbonyl group (—CO—), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or a combination thereof,
$Y_1$ is a single bond; a substituted or unsubstituted C1 to C30 alkylene group; a substituted or unsubstituted C2 to C30 alkenylene group; a substituted C1 to C30 alkylene group or a C2 to C30 alkenylene group wherein at least one methylene (—CH$_2$—) group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group) or a combination thereof,
m is an integer of 1 or more,
k1 is 0 or an integer of 1 or more,
k2 is an integer of 1 or more, and
a sum of m and k2 is an integer of 3 or more,
provided that when $Y_1$ is not a single bond, m does not exceed the valence of $Y_i$, and provided that a sum of k1 and k2 does not exceed the valence of $L_1$,
wherein a weight ratio of the first photoinitiator and the second photoinitiator is about 1:1 to 1:0.1;
wherein an amount of the first quantum dots is greater than or equal to about 10 weight % and less than or equal to about 40 weight %, and an amount of the reactive compound is greater than 1 weight % and less than or equal to about 40 weight %, based on a total weight of the first photosensitive composition.

2. The color filter of claim 1, wherein the amount of the first quantum dots is greater than or equal to about 12 weight % based on a total weight of the first photosensitive composition.

3. The color filter of claim 2, wherein in the first photosensitive composition, the amount of the reactive compound is greater than or equal to about 15 weight % based on a total weight of the first photosensitive composition.

4. The color filter of claim 1, wherein in the first photosensitive composition, the amount of the reactive compound is greater than or equal to about 15 weight % based on a total weight of the first photosensitive composition.

5. The color filter of claim 2, wherein the first quantum dots emit red light or green light.

6. The color filter of claim 1, wherein the quantum dot-polymer composite pattern further comprises a second quantum dot polymer composite disposed on the substrate and separately from the first quantum dot polymer composite, and
wherein the second quantum dot polymer composite is configured to emit a second light different from the first light and comprises a polymerization production of a second photosensitive composition comprising:
a plurality of second quantum dots being configured to emit the second light;
the photoinitiator system comprising the first photoinitiator and the second photoinitiator;
a polymer comprising a carboxylic acid group; and
the photopolymerizable monomer,
wherein the second photosensitive composition further comprises the reactive compound,
wherein in the second photosensitive composition, a weight ratio of the first photoinitiator and the second photoinitiator is about 1:1 to 1:0.1;
wherein an amount of the second quantum dots including the organic ligand is greater than or equal to about 10 weight % and less than or equal to about 40 weight %, and an amount of the reactive compound is greater than 1 weight % and less than or equal to about 40 weight %, based on a total weight of the second photosensitive composition.

7. The color filter of claim 6, wherein the second quantum dots emit green light or red light.

8. The color filter of claim 1, wherein the first quantum dot polymer composite is configured to maintain a blue light photoconversion rate of greater than or equal to about 40% of an initial value thereof after being exposed to light, developed, and heated at 180° C. for 30 minutes.

9. The color filter of claim 1, wherein the plurality of the first quantum dots comprises a organic ligand and the organic ligand comprises RCOOH, $RNH_2$, $R_2NH$, $R_3N$, RSH, $R_3PO$, $R_3P$, ROH, RCOOR', $RPO(OH)_2$, $R_2POOH$ (wherein R and R' are each independently a C5 to C24 aliphatic hydrocarbon group or a C6 to C20 aromatic hydrocarbon group), a polymer organic ligand, or a combination thereof.

10. The color filter of claim 1, wherein the first quantum dots comprises a Group II-VI compound, a Group III-V compound, a Group I-III-VI compound, a Group I-II-IV-VI compound, or a combination thereof.

11. The color filter of claim 1, wherein the oxime compound comprises an arylthioaryl group, an acyl group RC(=O)— (wherein R is a C1 to C30 alkyl group, a C6 to C30 aryl group, or a C6 to C30 cycloalkyl group), C3 to C30 cycloalkyl group, an alkanedione group, or a combination thereof,
wherein the aminoketone compound comprises a dialkylamino group, a morpholinylphenyl group, an acetophenone group, or a combination thereof, and
wherein the phosphine oxide compound comprises acylphosphine oxide.

12. The color filter of claim 9, wherein the oxime compound is an oxime compound having an arylthioaryl moiety,
wherein the aminoketone compound comprises 2-dimethylamino-2-(4-methylbenzyl)-1-(4-morpholin-4-yl-phenyl)-butan-1-one, and
wherein the phosphine oxide compound comprises a mixture of monoacyl phosphine oxide compound and a bisacylphosphine oxide compound.

13. The color filter of claim 1, wherein the reactive compound comprises ethoxylated pentaerythritol tetra(3-mercaptopropionate), trimethylolpropanetri(3-mercaptopropionate), trimethylolpropanetri(3-mercaptoacetate), glycol di-3-mercaptopropionate, polypropylene glycol di-3-mercaptopropionate, ethoxylated trimethylpropane tri(3-mercaptopropionate), glycol dimercaptoacetate, ethoxylated glycol dimercaptoacetate, 1,4-bis(3-mercaptobutyryloxy) butane, trimethylolpropanetris(3-mercaptopropionate), tris [2-(3-mercaptopropinonyloxy)ethyl]isocyanurate, 1,3,5-tris (3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol comprising 1 to 10 ethylene glycol structural units, or a combination thereof.

14. The color filter of claim 1, wherein the reactive compound comprises a dithiol compound and the first photosensitive composition does not comprise a trithiol compound, a tetrathiol compound, or a combination thereof.

15. The color filter of claim 1, wherein the first quantum dot composite further comprises a light diffusing agent selected from a metal oxide particle, a metal particle, or a combination thereof.

16. The color filter of claim 15, wherein the light diffusing agent comprises a titanium oxide particle.

17. A display device comprising a color filter of claim 1.

* * * * *

UNITED STATES PATENT AND TRADEMARK OFFICE
CERTIFICATE OF CORRECTION

| | | |
|---|---|---|
| PATENT NO. | : 12,055,852 B2 | Page 1 of 1 |
| APPLICATION NO. | : 17/234126 | |
| DATED | : August 6, 2024 | |
| INVENTOR(S) | : Shang Hyeun Park et al. | |

It is certified that error appears in the above-identified patent and that said Letters Patent is hereby corrected as shown below:

On the Title Page

Item (73) Assignee, Please change "SAMSUNG ELECTRONICS CO., LTD. SAMSUNG SDI CO., LTD." to --SAMSUNG ELECTRONICS CO., LTD. SAMSUNG SDI CO., LTD. SAMSUNG DISPLAY CO., LTD.--.

Signed and Sealed this
Fifteenth Day of July, 2025

Coke Morgan Stewart
*Acting Director of the United States Patent and Trademark Office*